United States Patent
Tseng et al.

(10) Patent No.: US 9,029,051 B2
(45) Date of Patent: *May 12, 2015

(54) PHOTOSENSITIVE RESIN COMPOSITION, COLOR FILTER AND LIQUID CRYSTAL DISPLAY DEVICE

(71) Applicant: Chi Mei Corporation, Tainan (TW)

(72) Inventors: Ching-Yuan Tseng, Zhongli (TW); Hao-Wei Liao, Kaohsiung (TW)

(73) Assignee: Chi Mei Corporation, Tainan (TW)

(*) Notice: Subject to any disclaimer, the term of this patent is extended or adjusted under 35 U.S.C. 154(b) by 48 days.

This patent is subject to a terminal disclaimer.

(21) Appl. No.: 13/789,769

(22) Filed: Mar. 8, 2013

(65) Prior Publication Data

US 2013/0244177 A1    Sep. 19, 2013

(30) Foreign Application Priority Data

Mar. 19, 2012  (TW) .............................. 101109368 A

(51) Int. Cl.

| | | |
|---|---|---|
| G03F 7/038 | (2006.01) | |
| G02B 5/20 | (2006.01) | |
| G03F 7/031 | (2006.01) | |
| G02B 5/23 | (2006.01) | |
| G03F 7/00 | (2006.01) | |
| G03F 7/004 | (2006.01) | |
| G03F 7/032 | (2006.01) | |
| G03F 7/075 | (2006.01) | |

(52) U.S. Cl.
CPC ........ *G03F 7/031* (2013.01); *G02B 5/23* (2013.01); *G02B 5/201* (2013.01); *G03F 7/0007* (2013.01); *G03F 7/0046* (2013.01); *G03F 7/032* (2013.01); *G03F 7/038* (2013.01); *G03F 7/0388* (2013.01); *G03F 7/0757* (2013.01)

(58) Field of Classification Search
CPC ....... G03F 7/031; G03F 7/038; G03F 7/0388; G03F 7/0007; G02B 5/201; G02B 5/22; G02B 5/223; G02F 1/133512; G02F 1/133514
USPC .............................. 430/7, 286.1, 287.1, 280.1
See application file for complete search history.

(56) References Cited

U.S. PATENT DOCUMENTS

| 7,556,843 B2 | 7/2009 | Kura et al. | |
|---|---|---|---|
| 7,732,504 B2 | 6/2010 | Dietliker et al. | |
| 2009/0042126 A1 | 2/2009 | Tanaka et al. | |
| 2011/0117333 A1 | 5/2011 | Furukawa | |
| 2013/0135763 A1* | 5/2013 | Liao et al. | 359/891 |
| 2013/0228727 A1* | 9/2013 | Liao et al. | 252/586 |

FOREIGN PATENT DOCUMENTS

| CN | 1547683 | | 11/2004 |
|---|---|---|---|
| CN | 1914560 | A | 2/2007 |
| CN | 101233452 | A | 7/2008 |
| CN | 102015633 | A | 4/2011 |
| JP | 2006-259716 | | 9/2006 |
| JP | 2011-122151 | | 6/2011 |
| TW | 201013316 | | 4/2010 |
| WO | 2009/133843 | A1 | 11/2009 |

OTHER PUBLICATIONS

English translation of abstract of JP 2006-259716 (published Sep. 28, 2006).
English translation of abstract of JP 2011-122151 (published Jun. 23, 2011).
English translation of abstract of TW 201013316 (published Apr. 1, 2010).
English translation of abstract of CN 1547683 (published Nov. 17, 2004).

* cited by examiner

*Primary Examiner* — John A McPherson
(74) *Attorney, Agent, or Firm* — McClure, Qualey & Rodack, LLP

(57) ABSTRACT

A photosensitive resin composition is provided, which comprises an alkali-soluble resin (A), a polysiloxane polymer (B), a compound containing vinyl unsaturated group(s) (C), a photoinitiator (D), a solvent (E), a black pigment (F) and a light stabilizer (G). The alkali-soluble resin (A) includes a resin having unsaturated group(s) (A-1), which is obtained by reacting an epoxy compound having at least two epoxy groups (a-1) with a compound having at least one vinyl unsaturated group and carboxyl group (a-2). The light stabilizer (G) includes a UV absorber (G-1) and/or a hindered amine (G-2). Therefore, the photosensitive resin composition has an excellent temporal stability, and a black matrix formed by such composition has a better heat resistance.

10 Claims, No Drawings

PHOTOSENSITIVE RESIN COMPOSITION, COLOR FILTER AND LIQUID CRYSTAL DISPLAY DEVICE

RELATED APPLICATIONS

This application claims priority to Taiwan Application Serial Number 101109368, filed on Mar. 19, 2012, which is herein incorporated by reference.

BACKGROUND

1. Field of Invention

The present invention relates to a photosensitive resin composition for a black matrix, and a black matrix, a color filter and a liquid crystal display (LCD) by using the same. More particularly, the present invention relates to a photosensitive resin having excellent temporal stability and heat resistance for a black matrix, and a color filter and a liquid crystal display (LCD) by using the black matrix.

2. Description of Related Art

A color filter has been widely applied on many fields such as color liquid crystal display (LCD) devices, color faxes, color cameras and the like. As the demand for office instruments such as the color LCD devices continuously increases and the related technologies have a drastic advance, resulting in the higher resolution requirement.

As everyone knows, a photosensitive resin composition has been widely applied to the process of the color filter, desired color pixels, the black matrix (or called as the shielding layer) and the like can be formed on a substrate by the photosensitive resin composition. In briefly, the pigments are dispersed in the photosensitive resin composition and coated onto a transparent substrate. After the steps of exposure, development, postbake and the like, the photosensitive resin composition can be made to the color pixels, the black matrix and so on. Recently, for enhancing the contrast and displaying quality of the LCD, the black matrix is formed in the gaps of strips and dots by using photolithography process, for example, thereby preventing the problems of less contrast and less color purity (chromaticity) resulted from the light leakage among the pixels.

Since the requirement for the shielding ability of the black matrix is more stringent, one of the solutions is to increase the amount of the black pigment, so as to increase the shielding ability, sensitivity, adhesiveness and to reduce the residue of the black matrix. For example, a photoresensitive resin composition for color filter is disclosed in Japanese Patent Laid-Open No. 2006-259716, which includes a pigment, an alkali-soluble resin, a photoinitiator, a reactive monomer having two functional groups and an organic solvent. The aforementioned reactive monomer is used to improve the reaction of those compounds, for forming highly fine patterns and increasing sensitivity, adhesiveness and reducing the residue of the black matrix.

Moreover, an alkali-soluble resin and a photoresensitive resin composition containing the same are disclosed in Japanese Patent Laid-Open No. 2011-122151. The alkali-soluble resin has a specific structure. When the photoresensitive resin composition that includes such alkali-soluble resin is applied in the process of the black matrix, sensitivity and adhesiveness of the photoresensitive resin composition that contains high amount of the black pigment can be elevated, so as to form ultra-fine wiring patterns.

The photoresensitive resin composition that contains high amount of the black pigment can satisfy the requirement of this industry. However, there are some problems existed in the photoresensitive resin composition, for example, such photoresensitive resin composition has worse temporal stability for it is sensitive to heat during the storage under a highly thermal environment.

Moreover, a touch panel is easy to use and widely applied in various end products of consumer electronics. However, in the condition of the touch panel more often working under direct exposure of the sunlight, the highly thermal environment will influence the black matrix, and the thermal ability and the display quality of the screen will be worse.

Accordingly, it is necessary to provide a photosensitive resin composition for exhibiting better temporal stability and thermal resistance and improving shortcomings of temporal instability and worse thermal resistance of the prior photosensitive resin composition after being heated.

SUMMARY

A photosensitive resin composition is provided, which comprises an alkali-soluble resin (A), a polysiloxane polymer (B), a compound containing vinyl unsaturated group(s) (C), a photoinitiator (D), a solvent (E), a black pigment (F) and a light stabilizer (G). The alkali-soluble resin (A) includes a resin having unsaturated group(s) (A-1), which is obtained by reacting an epoxy compound having at least two epoxy groups (a-1) with a compound having at least one vinyl unsaturated group and carboxyl group (a-2). The light stabilizer (G) includes a UV absorber (G-1) and/or a hindered amine (G-2). Therefore, a black matrix formed by such photosensitive resin composition has excellent temporal stability and heat resistance.

Moreover, a black matrix formed by the aforementioned photosensitive resin is provided.

Furthermore, a color filter including the aforementioned black matrix is provided.

In addition, a liquid crystal display (LCD) device including the aforementioned color filter is provided, for improving the disadvantages of worse temporal stability and heat resistance due to the photosensitive resin composition that includes high amount of black dye and is susceptible to high heat.

Photosensitive Resin Composition

Before proceeding further, it is appropriate to refer that the invention provides a photosensitive resin composition, which comprises an alkali-soluble resin (A), a polysiloxane polymer (B), a compound containing vinyl unsaturated group(s) (C), a photoinitiator (D), a solvent (E), a black pigment (F) and a light stabilizer (G), all of which is detailed as follows.

It should be supplemented that, (methyl)acrylic acid refers to acrylic acid and/or methacrylic acid, (methyl)acrylate ester refers to acrylate ester and/or methacrylate ester, and similarly, (methyl)acryloyl group refers to acryloyl group and/or methacryloyl group.

Alkali-Soluble Resin (A)

The alkali-soluble resin (A) of the present invention includes a resin having unsaturated group(s) (A-1), and the resin having unsaturated group(s) (A-1) is obtained by subjecting a mixture to a polymerization. The mixture includes an epoxy compound having at least two epoxy groups (a-1) with a compound having at least one vinyl unsaturated group and carboxyl group (a-2). In addition, the mixture further optionally includes a carboxylic acid anhydride compound (a-3) and/or a compound containing epoxy group(s) (a-4).

(1) Resin Having Unsaturated Group(s) (A-1)

(1.1) Epoxy Compound Having at Least Two Epoxy Groups (A-1)

The aforementioned epoxy compound having at least two epoxy groups (a-1) comprises a structure of Formula (I):

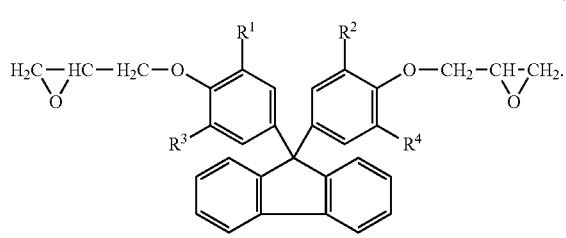

(I)

In the Formula (I), $R^1$, $R^2$, $R^3$ and $R^4$ independently represent a hydrogen atom, a halogen atom, an alkyl group with one to five carbon atoms, an alkoxy group with one to five carbon atoms, or an aromatic hydrocarbon group with six to twelve carbon atoms.

The aforementioned epoxy compound having at least two epoxy groups (a-1) listed in Formula (I) can include but be not limited to bisphenol fluorine compound containing epoxy group(s) that is obtained by reacting bisphenol fluorine compound with epihalohydrin.

In detail, examples of the aforementioned bisphenol fluorine compound can include but be not limited to 9,9-bis(4-hydroxyphenyl)fluorine, 9,9-bis(4-hydroxy-3-methylphenyl)fluorine, 9,9-bis(4-hydroxy-3-chlorophenyl)fluorine, 9,9-bis(4-hydroxy-3-bromophenyl)fluorine, 9,9-bis(4-hydroxy-3-fluorophenyl)fluorine, 9,9-bis(4-hydroxy-3-methoxyphenyl)fluorine, 9,9-bis(4-hydroxy-3,5-dimethylphenyl)fluorine, 9,9-bis(4-hydroxy-3,5-dichlorophenyl)fluorine, 9,9-bis(4-hydroxy-3,5-dibromophenyl)fluorine and so on.

Suitable examples of the aforementioned epihalohydrin can include but be not limited to 3-chloro-1,2-epoxypropane (epichlorohydrin), 3-bromo-1,2-epoxypropane (epibromohydrin) and so on.

The resulted bisphenol fluorine compound containing epoxy group(s) may include but be not limited to the commercially available products such as: (1) ESF-300 manufactured by NIPPON STEEL CHEMICAL Co., Ltd.; (2) PG-100, EG-210 and the like manufactured by OSAKA GAS Co., Ltd.; (3) SMS-F9PhPG, SMS-F9CrG, SMS-F914PG and the like manufactured by S.M.S Technology Co.

Moreover, the aforementioned epoxy compound having at least two epoxy groups (a-1) further comprises a structure of Formula (II):

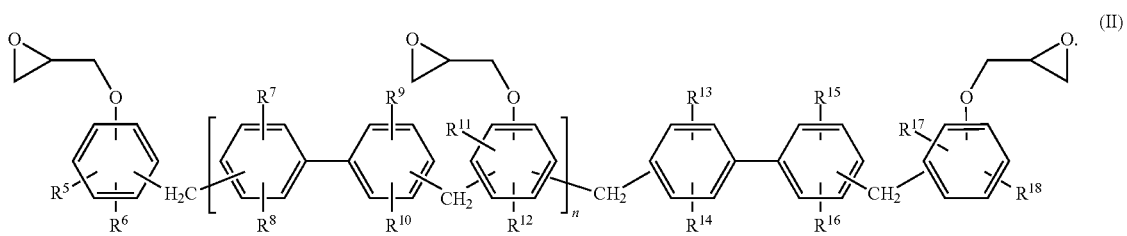

(II)

In the Formula (II), $R^5$ to $R^{18}$ are the same or different from each other and each independently represents a hydrogen atom, a halogen atom, an alkyl group with one to eight carbon atoms or an aromatic hydrocarbon group with six to fifteen carbon atoms, and n represents an integer of zero to ten.

The aforementioned epoxy compound having at least two epoxy groups (a-1) listed in Formula (II) can be obtained by reacting a compound listed in Formula (II-1) with halogenated epoxypropane:

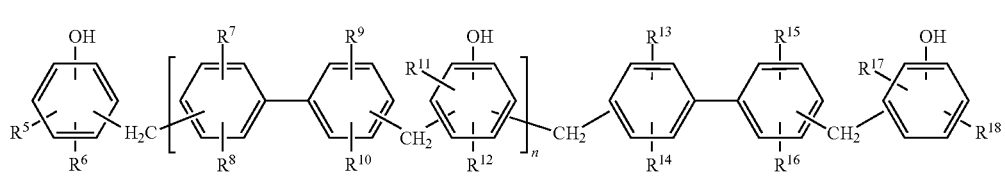

(II-1)

In the Formula (II-1), $R^5$ to $R^{18}$ and n have the same definitions with the ones of Formula (II) respectively rather than being reciting them in detail.

Furthermore, the aforementioned epoxy compound having at least two epoxy groups (a-1) listed in Formula (II) is condensed with a compound listed in Formula (II-2) and phenol in the presence of an acid catalyst, thereby forming the compound listed in Formula (II-1). Next, a dehydrohalogenation reaction is carried out by adding excess of halogenated epoxypropane into the above reaction solution, so as to obtain the epoxy compound having at least two epoxy groups (a-1) listed in Formula (II).

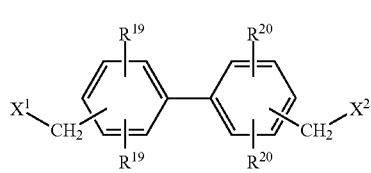

(II-2)

In the Formula (II-2), $R^{19}$ and $R^{20}$ independently represent a hydrogen atom, a halogen atom, an alkyl group with one to eight carbon atoms or an aromatic hydrocarbon group with six to fifteen carbon atoms; $X^1$ and $X^2$ independently represent a halogen atom, an alkyl group with one to six carbon atoms or an alkoxy group with one to six carbon atoms. Preferably, the halogen atom may be chlorine or bromine; the alkyl group may be methyl, ethyl or tert-butyl group; the alkoxy group may be methoxy or ethoxy group.

Appropriate examples of the aforementioned phenols may include but be not limited to: phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol and the like. Typically, the aforementioned phenols may be used alone or in combinations of two or more.

Based on 1 mole of the compound listed in Formula (II-2), an amount of the phenols is typically 0.5 to 20 moles, preferably 2 to 15 moles.

Examples of the aforementioned acid catalyst may include but be not limited to: hydrogen chloride, sulfuric acid, p-toluenesulfonic acid, oxalic acid, boron trifluoride, aluminium chloride anhydrous, zinc chloride and the like. However, p-toluenesulfonic acid, hydrogen chloride and sulfuric acid are preferably used. Typically, the aforementioned acid catalyst may be used alone or in combinations of two or more.

In addition, there are no limitations specific to the amount of the aforementioned acid catalyst. However, in the preferable condition, based on 100 percentages by weight of the compound listed in Formula (II-2), an amount of the acid catalyst is typically 0.1 to 30 percentages by weight.

The aforementioned condensation reaction can be performed without any solvent or in the presence of an organic solvent. Examples of the aforementioned organic solvent may include but be not limited to toluene, xylene, methyl isobutyl ketone and so on. The aforementioned organic solvent may be used alone or in combinations of two or more.

Based on 100 percentages by weight of the compound listed in Formula (II-2) and the phenols, an amount of the organic solvent is typically 50 to 300 percentages by weight, and preferably 100 to 250 percentages by weight. In addition, the aforementioned condensation reaction is operated under a temperature of 40° C. to 180° C. for a period of 1 hour to 8 hours.

After the condensation reaction is finished, a neutralization or rinse treatment can be performed. In the aforementioned neutralization treatment, pH value of the reaction solution is adjusted to pH3 to pH7, and preferably pH5 to pH7. A neutralization reagent may be used in the aforementioned rinse treatment, in which the neutralization reagent is an alkaline substance and its examples may include but be not limited to alkali metal hydroxides such as sodium hydroxide, potassium hydroxide and the like; alkaline earth metal hydroxides such as calcium hydroxide, magnesium hydroxide and the like; organic amines such as diethylene triamine, triethylenetetramine, aniline, phenylene diamine and the like; and ammonia, sodium dihydrogen phosphate and so on. Conventional methods can be used in the aforementioned rinse treatment. For example, a neutralizing reagent-containing solution is added into the reaction solution followed by repetitively extracting. After the neutralization or rinse treatment is finished, unreactive phenols and solvents in the product are evaporated and removed by using a heating treatment under decreased pressure, and then concentrated, thereby obtaining the compound listed in Formula (II-1).

Examples of the aforementioned halogenated epoxypropane (epihalohydrin) may include but be not limited to 3-chloro-1,2-epoxypropane (epichlorohydrin), 3-bromo-1,2-epoxypropane (epibromohydrin) and the combination thereof. Before proceeding the aforementioned dehydrohalogenation reaction, alkali metal hydroxides such as sodium hydroxide, potassium hydroxide can be added before or during the reaction process. The aforementioned dehydrohalogenation reaction is carried out under a temperature of 20° C. to 120° C. for a period of 1 hour to 10 hours.

In an embodiment, the formulation of the alkali metal hydroxide can be also used in an aqueous solution for adding into the aforementioned dehydrohalogenation reaction. In this example, when the solution of the alkali metal hydroxides is continuously added into the dehydrohalogenation reaction system, water and halogenated epoxypropane (epihalohydrin) can be simultaneously distillated out under a normal or decreased pressure, thereby separating and removing water, as well as reflowing the epihalohydrin back into the reaction system continuously.

Before the aforementioned dehydrohalogenation reaction is carried out, a tertiary ammonium salt such as tetramethyl ammonium chloride, tetramethyl ammonium bromide, trimethyl benzyl ammonium chloride or the like can be used as a catalyst and added into the dehydrohalogenation reaction system, followed by performing a reaction under a temperature of 50° C. to 150° C. for a period of 1 hour to 5 hours. Next, the alkali metal hydroxide or its solution can be then added into such reaction system under a temperature of 20° C. to 120° C. for a period of 1 hour to 10 hours for carrying out the dehydrohalogenation reaction.

Based on the total hydroxyl equivalent amount of the compound listed in Formula (II-2) as 1 equivalent, an amount of the epihalohydrin is typically 1 to 20 moles, preferably 2 to 10 equivalents. Based on the total hydroxyl groups in the compound listed in Formula (II-1) as 1 equivalent, an amount of the alkali metal hydroxide added in the dehydrohalogenation reaction is typically 0.8 to 15 equivalents, preferably 0.9 to 11 equivalents.

In addition, for the purpose of successful execution of the dehydrohalogenation reaction, a polar aprotic solvent such as dimethyl sulfone, dimethyl sulfoxide and the like can be also added. When an alcohol is used in the reaction, based on 100 percentage by weight of the epihalohydrin, an amount of the alcohol is 2 to 20 percentage by weight, and preferably 4 to 15 percentage by weight. When the polar aprotic solvent is used in the reaction, based on 100 percentage by weight of the epihalohydrin, an amount of the polar aprotic solvent is 5 to 100 percentage by weight, and preferably 10 to 90 percentage by weight.

After the dehydrohalogenation reaction is completed, a rinse treatment is optionally performed. Afterward, the epihalohydrin, the alcohol and the polar aprotic solvent can be removed by using a heating treatment of 110° C. to 250° C. under decreased pressure of less than 1.3 kPa (10 mmHg).

For preventing hydrolytic halogen included in the resulted epoxy resin, toluene, methyl isobutyl ketone or the like can be added into the solution that has reacted after the dehydrohalogenation reaction, and then the solution of the alkali metal hydroxide such as sodium hydroxide, potassium hydroxide can be added to perform the dehydrohalogenation reaction again. During the dehydrohalogenation reaction, based on the total hydroxyl groups in the compound listed in Formula (II-1) as 1 equivalent, an amount of the alkali metal hydroxide added in the dehydrohalogenation reaction is typically 0.01 to 0.3 moles, preferably 0.05 to 0.2 moles. In addition, the dehydrohalogenation reaction is operated in a temperature of 50° C. to 120° C. for a period of 0.5 hour to 2 hours.

After the dehydrohalogenation reaction is finished, salts can be removed by using processes of filtration, rinse and so on. In addition, toluene, methyl isobutyl ketone or the like can be distilled out and removed, thereby obtaining an epoxy compound having at least two epoxy groups (a-1). The epoxy compound having at least two epoxy groups (a-1) the commercially available products such as NC-3000, NC-3000H, NC-3000S, NC-3000P and the like manufactured by NIPPON KAYAKU Co., Ltd.

(1.2) Compound Having at Least One Vinyl Unsaturated Group and Carboxyl Group (a-2)

The aforementioned compound having at least one vinyl unsaturated group and carboxyl group (a-2) is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl cis-hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl hydrophthalic acid, 2-methacryloyloxybutyl hexahydrophthalic acid or 2-methacryloyloxybutyl hydrophthalic acid; (2) a compound obtained by reacting (methyl)acrylate ester having hydroxyl group(s) with a dicarboxylic acid compound, in which the dicarboxylic acid compound may include but be not limited to hexanedioic acid, butanedioic acid, maleic acid, and phthalic acid; (3) a compound obtained by reacting (methyl)acrylate ester having hydroxyl group(s) with a carboxylic acid anhydride compound (a-3), in which the (methyl)acrylate ester having hydroxyl group(s) may include but be not limited to (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, pentaerythritol triacrylate and so on. In addition, the carboxylic acid anhydride compound described herein is the same with the carboxylic acid anhydride compound (a-3) in the aforementioned mixture of the resin having unsaturated group(s) (A-1) rather than being recited herein.

As aforementioned, the mixture of the resin having unsaturated group(s) (A-1) can optionally include the carboxylic acid anhydride compound (a-3) and/or the compound containing epoxy group(s) (a-4). The carboxylic acid anhydride compound (a-3) can be selected from the group consisting of the following subgroups (1) to (2): (1) a dicarboxylic acid anhydride compound such as butanedioic anhydride, maleic anhydride, itaconic anhydride, phthalic anhydride, tetrahydrophthalic anhydride, hexahydrophthalic anhydride, methyltetrahydrophthalic anhydride, methylhexahydrophthalic anhydride, methyl endo-methylene tetrahydrophthalic anhydride, chlorendic anhydride, 1,3-dioxoisobenzofuran-5-carboxylic anhydride and the like; and (2) a tetracarboxylic acid anhydride compound such as benzophenone tetracarboxylic dianhydride (BTDA), diphthalic dianhydride, diphenyl ether tetracarboxylic acid dianhydride and the like.

The aforementioned compound containing epoxy group(s) (a-4) is selected from the group consisting of glycidyl methacrylate, 3,4-epoxycyclohexyl methacrylate, glycidyl ether compound having unsaturated group(s), unsaturated compound having epoxy group(s) or any combination thereof. The glycidyl ether compound having unsaturated group(s) may include but be not limited to the commercially available products such as Denacol EX-111, Denacol EX-121, Denacol EX-141, Denacol EX-145, Denacol EX-146, Denacol EX-171, Denacol EX-192 and so on manufactured by Nagase ChemteX Corporation.

The aforementioned resin having unsaturated group(s) (A-1) can be synthesized as follows. The epoxy compound having at least two epoxy groups (a-1) and the compound having at least one vinyl unsaturated group and carboxyl group (a-2) are polymerized and formed to an intermediate product having hydroxyl group(s), and then the intermediate product reacts with the carboxylic acid anhydride compound (a-3), so as to obtain the resin having unsaturated group(s) (A-1). Preferably, based on the total hydroxyl equivalent amount of the intermediate product having hydroxyl group(s) as 1 equivalent, the total anhydride equivalent amount of the carboxylic acid anhydride compound (a-3) is 0.4 to 1 equivalent, and preferably 0.75 to 1 equivalent. When a plurality of the carboxylic acid anhydride compound (a-3) are used in this reaction, they can be added sequentially or simultaneously in the reaction. Preferably, when dicarboxylic acid anhydride compound and tetracarboxylic acid anhydride compound are employed as the carboxylic acid anhydride compound (a-3), the molar ratio of dicarboxylic acid anhydride compound to the tetracarboxylic acid anhydride compound may be 1/99 to 90/10, and preferably 5/95 to 80/20. In addition, this reaction can be operated under a temperature of 50° C. to 130° C.

The aforementioned resin having unsaturated group(s) (A-1) can be synthesized as follows. The epoxy compound having at least two epoxy groups (a-1) and the compound having at least one vinyl unsaturated group and carboxyl group (a-2) both listed in Formula (I) are reacted to an intermediate product having hydroxyl group(s), and then the intermediate product reacts with the carboxylic acid anhydride compound (a-3) and/or a compound containing epoxy group(s) (a-4), so as to obtain the resin having unsaturated group(s) (A-1). Preferably, based on the total epoxy equivalent amount of the epoxy compound having at least two epoxy groups (a-1) listed in Formula (II) as 1 equivalent, the total acid equivalent amount of the compound having at least one vinyl unsaturated group and carboxyl group (a-2) is 0.8 to 1.5 equivalent, and preferably 0.9 to 1.1 equivalent. Based on the total hydroxyl equivalent amount of the intermediate product having hydroxyl group(s) as 100 percentage by mole (mole %), an amount of the carboxylic acid anhydride compound (a-3) is 10 to 100 mole %, preferably 20 to 100 mole %, and more preferably 30 to 100 mole %.

During the preparation of the resin having unsaturated group(s) (A-1), the reaction solution is usually added with an alkaline compound as a reaction catalyst for accelerating the reaction. The reaction catalyst may be used alone or in combinations of two or more, and the reaction may include but be not limited to triphenyl phosphine, triphenyl stibine, triethylamine, triethanolamine, tetramethylammonium chloride, benzyltriethylammonium chloride and the like. Preferably, based on a total weight of the epoxy compound having at least two epoxy groups (a-1) and the compound having at least one vinyl unsaturated group and carboxyl group (a-2) as 100 parts by weight, an amount of the reaction catalyst is 0.01 to 10 parts by weight, and preferably 0.3 to 5 parts by weight.

In addition, for the purpose of controlling the polymerization degree, a polymerization inhibitor is usually added into the reaction solution. The aforementioned polymerization inhibitor may include but be not limited to methoxyphenol, methylhydroquinone, hydroquinone, 2,6-di-t-butyl-p-cresol, phenothiazine and the like. Typically, the polymerization inhibitor may be used alone or in combinations of two or more. Based on the total weight of the epoxy compound having at least two epoxy groups (a-1) and the compound having at least one vinyl unsaturated group and carboxyl group (a-2) as 100 parts by weight, an amount of the polymerization inhibitor is 0.01 to 10 parts by weight, and preferably 0.1 to 5 parts by weight.

During the preparation of the resin having unsaturated group(s) (A-1), a polymerization reaction solvent can be use if necessary. Examples of the polymerization reaction solvent may include but be not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol) alkyl ether compounds such as di(propylene glycol) methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization reaction solvent may be used alone or in combinations of two or more. An acid equivalent of the resin having unsaturated group(s) (A-1) is 50 mg KOH/g to 200 mg KOH/g, and preferably 60 mg KOH/g to 150 mg KOH/g.

Based on the amount of the alkali-soluble resin (A) as 100 parts by weight, the amount of the resin having unsaturated group(s) (A-1) is 30 to 100 parts by weight, preferably 50 to 100 parts by weight, and more preferably 70 to 100 parts by weight. The resulted photosensitive resin composition would have disadvantages such as insufficiently thermal resistance if it totally included no the resin having unsaturated group(s) (A-1).

(2) Other Alkali-Soluble Resin (A-2)

The alkali-soluble resin (A) described herein may further include other alkali-soluble resin (A-2). The other alkali-soluble resin (A-2) can include but be not limited to a resin containing carboxyl or hydroxyl groups, for example, acrylic resin except from the resin having unsaturated group(s) (A-1), urethane resin, novolac resin and the like.

Based on the total amount of the alkali-soluble resin (A) as 100 parts by weight, the amount of the other alkali-soluble resin (A-2) is 0 to 70 parts by weight, preferably 0 to 50 parts by weight, and more preferably 0 to 30 parts by weight.

Polysiloxane Polymer (B)

There is no specific limitation to the structure of polysiloxane polymer (B). However, the polysiloxane polymer (B) synthesized by subjecting silane monomer, polysiloxane or a combination of the silane monomer and the polysiloxane into a hydrolysis and a partial condensation is preferred.

In an embodiment, the silane monomer can include but be not limited to the one listed in Formula (VI):

$$SiR^{27}{}_m(OR^{28})_{4-m} \qquad (VI).$$

In the Formula (VI), $R^{27}$ represents a hydrogen atom, an alkyl group with one to ten carbon atoms, an alkenyl group with two to ten carbon atoms or an aromatic group with six to fifteen carbon atoms, in which any one of the alkyl group, the alkenyl group and the aromatic group as aforementioned optionally has a substituted group; m is an integer of 0 to 3, and all $R^{27}$ are the same or different from each other when the m is 2 or 3.

Examples of the aforementioned alkyl group can include but be not limited to methyl, ethyl, n-propyl, iso-propyl, n-butyl, tert-butyl, n-hexyl, n-decyl, trifluoromethyl, 3,3,3-trifluoropropyl, 3-glycidyl, 2-(3,4-epoxy cyclohexyl)ethyl, 3-aminopropyl, 3-mercaptopropyl, 3-isothiocyanopropyl, 2-oxetanylbutoxypropyl, 3-propyl pentanedioic acid anhydride propyl, 3-butanedioic acid anhydride propyl, 2-butanedioic acid anhydride ethyl groups and the like. Examples of the aforementioned alkenyl group can include but be not limited to ethylene, 3-acryloxypropyl or 3-methylacryloxypropyl groups and the like. Examples of the aromatic group can include but be not limited to phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, naphthyl groups and the like.

Moreover, in the Formula (VI), $R^{28}$ represents a hydrogen atom, an alkyl group with one to ten carbon atoms, an acyl group with one to six carbon atoms or an aromatic group with six to fifteen carbon atoms, in which any one of the alkyl group, the acyl group and the aromatic group as aforementioned optionally has a substituted group; and all $R^{28}$ are the same or different from each other when (4-m) is 2, 3 or 4.

Examples of the aforementioned alkyl group can include but be not limited to methyl, ethyl, n-propyl, iso-propyl, n-butyl groups and the like. Examples of the aforementioned acyl group can include but be not limited to acetyl group. Examples of the aforementioned aromatic group can include but be not limited to phenyl group.

Furthermore, in the Formula (VI), the silane monomer is tetrafunctional siloxane when the m is 0; the silane monomer is trifunctional siloxane when the m is 1; the silane monomer is difunctional siloxane when the m is 2; and the silane monomer is monofunctional siloxane when the m is 3.

Examples of the aforementioned polysiloxane can include but be not limited to the tetrafunctional siloxanes such as tetramethoxysiloxane, tetraethoxysiloxane, tetraacetoxysilane, tetraphenoxysiloxane and the like; the trifunctional siloxanes such as methyltrimethoxysilane (MTMS), methyltriethoxysilane, methyltriisopropoxysilane, methyl tri-n-butoxysilane, ethyltrimethoxysilane, ethyltriethoxysilane, ethyltriisopropoxysilane, ethyl tri-n-butoxysilane, n-propyltriethoxysilane, n-butyltrimethoxysilane, n-butyltriethoxysilane, n-hexyltrimethoxysilane, n-hexyltriethoxysilane, decyltrimethoxysilane, ethylenetrimethoxysilane, ethylenetriethoxysilane, 3-acryloxypropyltrimethoxysilane, 3-acryloxypropyltriethoxysilane, 3-methylacryloxypropyltrimethoxysilane, 3-methylacryloxypropyltriethoxysilane, phenyltrimethoxysilane (PTMS), phenyltriethoxysilane (PTES), p-hydroxyphenyl trimethoxysilane, 1-(p-hydroxyphenyl)ethyl trimethoxysilane, 2-(p-hydroxyphenyl)ethyl trimethoxysilane, 4-hydroxy-5-(p-hydroxyphenyl carbonyloxy)pentyl trimethoxysilane, trifluoromethyl trimethoxysilane, trifluoromethyl triethoxysilane, 3,3,3-trifluoropropyl trimethoxysilane, 3-aminopropyl trimethoxysilane, 3-aminopropyl triethoxysilane, 3-glycidoxy propyl trimethoxysilane, 3-glycidoxy propyl triethoxysilane, 2-(3,4-epoxy cyclohexyl)ethyl trimethoxysilane, 3-mercaptopropyl trimethoxysilane, 2-oxetanyl butoxypropyl triphenoxysilane, the commercially available products manufactured by TOAGOSEI Co. Ltd. (for example, the trade name of TMSOX of 2-oxetanylbutoxypropyl trimethoxysilane, TESOX of 2-oxetanylbutoxypropyl triethoxysilane), 2-trimethoxysilylethyl butanedioic anhydride, 2-triphenoxysilylpropyl butanedioic anhydride, the commercially available products manufactured by SHIN-ETSU CHEMICAL Co. Ltd. (for example, the trade name X-12-967 of 3-trimethoxysilylpropyl butanedioic anhydride), the commercially available products manufactured by WACKER CHEMIE AG (for example, the trade name GF-20 of 3-triethoxysilyl propyl butanedioic anhydride), 3-trimethoxysilylpropyl glutaric anhydride (TMSG), 3-triethoxysilylpropyl glutaric anhydride, 3-triphenoxysilylpropyl glutaric anhydride and the like; the difunctional siloxanes such as dimethyldimethoxysilane (DMDMS), dimethyldiethoxysilane, dimethyldiacetoxysilane, di-n-butyldimethoxysilane, diphenyldimethoxysilane, diisopropoxy-di(2-oxetanylbutoxy propyl)silane (DIDOS), di(3-glycidylpentyl)dimethoxysilane, di-[(2-butanedioic anhydride)propyl]di-n-butoxysilane, di-[(2-butanedioic anhydride)ethyl]dimethoxysilane and the like; the monofunctional siloxanes such as trimethylmethoxysilane, tri-n-butylethoxysilane, 3-glycidoxypropyldimethylmethoxysilane, 3-glycidoxypropyldimethylethoxysilane, tri-[(2-butanedioic anhydride)propyl] phenoxysilane, di-[(2-butanedioic anhydride)ethyl](methyl) methoxysilane and the like.

The above-mentioned silane monomer may be used alone or in combinations of two or more.

In another embodiment, the polysiloxane can include but be not limited to the one listed in Formula (VII):

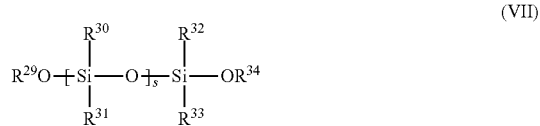

$$R^{29}O-\left[\begin{matrix}R^{30}\\|\\Si\\|\\R^{31}\end{matrix}-O\right]_s-\begin{matrix}R^{32}\\|\\Si\\|\\R^{33}\end{matrix}-OR^{34}$$ (VII)

In the Formula (VI), $R^{29}$ and $R^{34}$, which are the same or different from each other, each represents a hydrogen atom, an alkyl group with one to six carbon atoms, an acyl group with one to six carbon atoms or an aromatic group with six to fifteen carbon atoms, in which any one of the alkyl group, the acyl group and the aromatic group as aforementioned optionally has a substituted group. Examples of the aforementioned alkyl group can include but be not limited to methyl, ethyl, n-propyl, iso-propyl, n-butyl groups and the like. Examples of the aforementioned acyl group can include but be not limited to acetyl group. Examples of the aforementioned aromatic group can include but be not limited to phenyl group. The s is an integer of 1 to 1000, and preferably 5 to 200.

$R^{30}$, $R^{31}$, $R^{32}$ and $R^{33}$ of the Formula (VI), which are the same or different from each other, each represents a hydrogen atom, an alkyl group with one to ten carbon atoms, an alkenyl group with two to six carbon atoms or an aromatic group with six to fifteen carbon atoms, in which any one of the alkyl group, the alkenyl group and the aromatic group as aforementioned optionally has a substituted group, respectively; and when the s of the Formula (VI) is the integer of 2 to 1000, each $R^{30}$ is the same or different from each other, and $R^{31}$ is the same or different from each other. Examples of the aforementioned alkyl group can include but be not limited to methyl, ethyl, n-propyl groups and the like. Examples of the aforementioned alkenyl group can include but be not limited to vinyl, acryloxypropyl, methylacryloxypropyl groups and the like. Examples of the above-mentioned aromatic group can include but be not limited to phenyl, tolyl, naphthyl groups and the like.

Examples of the polysiloxane can include but be not limited to 1,1,3,3-tetramethyl-1,3-dimethoxy disiloxane, 1,1,3,3-tetramethyl-1,3-diethoxy disiloxane, 1,1,3,3-tetraethyl-1,3-diethoxy disiloxane, the commercially available products of silanol terminal polysiloxanes manufactured by GELEST Inc. (for example, the trade names DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400) and the like) and so on.

The above-mentioned polysiloxane can be used alone or in combinations of two or more. In addition, when the silane monomer and the polysiloxane are used in combination, there are no limitations specific to the mixing ratio thereof. Preferably, the molar ratio of the silane monomer and the polysiloxane in Si atom is 100:0 to 50:50.

Alternatively, the polysiloxane polymer (B) can be synthesized by subjecting the silane monomer and/or polysiloxane to hydrolysis and partial condensation, or by subjecting them mixed with silicon dioxide particles to copolymerization.

There are no limitations specific to the averaged particle size of the silicon dioxide particles. The averaged particle size of the silicon dioxide particles is generally 2 nm to 250 nm, preferably 5 nm to 200 nm, and more preferably 10 nm to 100 nm. Examples of the silicon dioxide particles can include but be not limited to commercially available products manufactured by JGC CATALYSTS & CHEMICALS Ltd., for example, the trade names OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol) and the like; commercially available products manufactured by FUSO CHEMICAL Co., Ltd., for example, the trade names Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone) and the like; and commercially available products manufactured NISSAN CHEMICAL INDUSTRIES, Ltd., for example, the trade names IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol) and the like.

The above-mentioned silicon dioxide particles can be used alone or in combinations of two or more. Moreover, when the silicon dioxide particles are mixed with the silane monomer and the polysiloxane, there are no limitations specific to their usage amounts. Preferably, the mole percentage of the silicon dioxide particles and the polysiloxane in Si atom are 1 to 50 mole percentage.

The hydrolysis and the partial condensation can be performed by using the well-known methods in the art. For example, the mixture of the silane monomer and/or the polysiloxane and/or the silicon dioxide particles can be added with a solvent, water, and optionally a catalyst, followed by stirring them under a temperature of 50 to 150° C. for 0.5 to 120 hours. During the stirring step, the by-products (for example, alcohols, water and the like) can be removed by distillation when necessary.

The solvent used in the hydrolysis and the partial condensation can be the same with or different from the solvent (E) of the photosensitive resin composition of the present invention rather than having limitations specific thereto. Based on a total weight of the silane monomer and the polysiloxane as 100 g, an amount of the solvent is 15 to 1200 g, and preferably 20 to 1100 g.

With regard to water used in the hydrolysis and the partial condensation, based on 1 mole of the hydrolyzable groups included in the mixture of the resin having unsaturated group(s) (A-1), the amount of water for the hydrolysis is 0.5 to 2 moles.

There are no specific limitations to the catalyst, and an acid catalyst or a alkali catalyst can be preferred. Examples of the acid catalyst can include but be not limited to hydrochloric acid, nitric acid, sulfuric acid, hydrofluoric acid, oxalic acid, phosphoric acid, acetic acid, trifluoroacetic acid, formic acid, polycarboxylic acids and anhydrides thereof, ion exchange resins and the like. Examples of the alkali catalyst can include but be not limited to diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilanes containing an amino group, ion exchange resins and the like.

Based on the total weight of the silane monomer and the polysiloxane as 100 g, the amount of the catalyst is 0.005 g to 15 g, preferably from 0.01 g to 12 g, and more preferably 0.05 g to 10 g.

In consideration of the storage stability, the polysiloxane polymer (B) can be optionally purified for excluding the by-products (for example, alcohols or water) and the catalyst therein preferably after the hydrolysis and the partial condensation. There are no specific limitations to the purification method. Preferably, the polysiloxane polymer (B) can be diluted in a hydrophobic solvent, an organic layer is then separated, washed by water several times and concentrated by using an evaporator for removing alcohols and water therein. In addition, the catalyst can be removed by using the ion exchange resin.

Based on the total amount of the alkali-soluble resin (A) as 100 parts by weight, the amount of the polysiloxane polymer (B) is 5 to 150 parts by weight, preferably 7 to 130 parts by weight, and more preferably 10 to 120 parts by weight. Furthermore, the photosensitive resin composition will be resulted in the disadvantage of insufficient heat resistance if there is no the polysiloxane polymer (B) included in the photosensitive resin composition.

In addition, the photosensitive resin composition includes 0.8 to 10.0 of a weight ratio (A-1)/(B) of the resin having unsaturated group(s) (A-1) to the polysiloxane polymer (B), preferably 0.9 to 9.5 of the weight ratio (A-1)/(B), and more preferably 1.0 to 9.0 of the weight ratio (A-1)/(B). When the weight ratio (A-1)/(B) of the resin having unsaturated group(s) (A-1) to the polysiloxane polymer (B) is in the above-mentioned ranges, the photosensitive resin composition will be resulted in the advantage of excellent heat resistance.

Compound Containing Vinyl Unsaturated Group(s) (C)

The compound containing vinyl unsaturated group(s) (C) described herein can include but be not limited to a compound having at least one vinyl unsaturated group (C-1) or a compound having at least two vinyl unsaturated groups (C-2) (including two vinyl unsaturated groups).

The compound having at least one vinyl unsaturated group (C-1) can include but be not limited to (meth)acrylamide, (meth)acryloyl morpholine, 7-amine-3,7-dimethyloctyl (meth)acrylate, isobutoxymethyl(meth)acrylamide, isobornyloxyethyl(meth)acrylate, isobornyl(meth)acrylate, 2-ethylhexyl(meth)acrylate, ethyldiethylene glycol(meth)acrylate, t-octyl(meth)acrylamide, diacetone(meth)acrylamide, dimethylaminoethyl(meth)acrylamide, dodecyl(meth)acrylamide, dicyclopentenyloxyethyl(meth)acrylate, dicyclopentadiene(meth)acrylate, N,N-dimethyl(meth)acrylamide, tetrachlorophenyl(meth)acrylate, 2-tetrachlorophenoxyethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl (meth)acrylate, vinylcaprolactam, N-vinylpyrrolidone, phenoxyethyl(meth)acrylate, pentachlorophenyl(meth)acrylate, pentachlorophenyl(meth)acrylate, polyethylene glycol mono(meth)acrylate, polypropylene glycol mono(meth)acrylate, bornyl(meth)acrylate and the like. The above-mentioned compound having at least one vinyl unsaturated group (C-1) can be used alone or in combinations of two or more.

The compound having at least two vinyl unsaturated groups (C-2) (including two vinyl unsaturated groups) can include but be not limited to ethylene glycol di(meth)acrylate, dicyclopentenyl(meth)acrylate, triethylene glycol di(meth)acrylate, tetraethylene glycol di(meth)acrylate, tris(2-hydroxyethyl)isocyanurate di(meth)acrylate, tris(2-hydroxyethyl)isocyanurate tri(meth)acrylate, caprolactone-modified tris(2-hydroxyethyl)isocyanurate tri(meth)acrylate, trimethylolpropyl tri(meth)acrylate, EO-modified trimethylolpropyl tri(meth)acrylate, PO-modified trimethylolpropyl tri (meth)acrylate, tripropylene glycol di(meth)acrylate, neopentyl glycol di(meth)acrylate, 1,4-butanediol di(meth) acrylate, 1,6-hexanediol di(meth)acrylate, pentaerythritol tri (meth)acrylate, pentaerythritol tetra(meth)acrylate, polyester di(meth)acrylate, polyethylene glycol di(meth)acrylate, dipentaerythritol hexa(meth)acrylate, dipentaerythritol penta (meth)acrylate, dipentaerythritol tetra(meth)acrylate, caprolactone-modified dipentaerythritol hexa(meth)acrylate, caprolactone-modified dipentaerythritol penta(meth)acrylate, di(trimethylolpropane) tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol tri(meth)acrylate, EO-modified bisphenol F di(meth)acrylate, novolac polyglycidyl ether (meth)acrylate and the like. The above-mentioned compound having at least two vinyl unsaturated groups (C-2) can be used alone or in combinations of two or more.

Examples of the compound containing vinyl unsaturated group(s) (C) can include but be not limited to trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, di(trimethylolpropane) tetraacrylate, PO-modified glycerol triacrylate and the like.

Based on the total amount of the alkali-soluble resin (A) as 100 parts by weight, the amount of the compound containing vinyl unsaturated group(s) (C) is 5 to 220 parts by weight, preferably 10 to 200 parts by weight, and more preferably 15 to 180 parts by weight, so that the photosensitive resin composition can exhibit excellent development.

Photoinitiator (D)

The photoinitiator (D) of the present invention can include but be not limited to an oxime compound (D-1), an acetophenone compound (D-2), other photoinitiator (D-3) and any combination thereof.

Examples of the oxime compound (C-1) include: ethanone, 1-[9-ethyl-6-(2-methylbezoyl)-9H-carbozole-3-yl]-1-(O-acetyl oxime) (for example, the trade name OXE02, manufactured by Ciba Specialty Chemicals Co.), ethanone, 1-[9-ethyl-6-(2-chloro-4-benzylsulfonyl benzoyl) 9H-carbozole-3-yl]-1-(O-acetyl oxime) (manufactured by Asahi Denka Co., Ltd.), 1-(4-phenyl-thiophenyl)-butane-1,2-dion 2-oxime-O-benzoate, 1-(4-phenyl-thiophenyl)-octane-1,2-dion 2-oxime-O-benzoate (the trade name OXE01, manufactured by Ciba Specialty Chemicals Co.), 1-(4-phenyl-thiophenyl)-octane-1-on oxime-O-acetate, 1-(4-phenyl-thiophenyl)-butane-1-on oxime-O-acetate and the like. The above-mentioned oxime compound (D-1) can be used alone or in combinations of two or more.

Examples of the acetophenone compound (D-2) include p-dimethylamino acetophenone, α,α'-dimethoxyazoxyacetophenone, 2,2'-dimethyl-2-acetophenone, p-methoxy acetophenone, 2-methyl-1-(4-methylthiophenyl)-2-morpholino-1-propanone, 2-benzyl-2-N,N-dimethylamino-1-(4-morpholinophenyl)-1-butanone (or example, the trade name IRGACURE 369, manufactured by Ciba Specialty Chemicals Co.) and the like. Among those, 2-methyl-1-(4-methylthiophenyl)-2-morpholino-1-propanone and 2-benzyl-2-N,N-dimethylamino-1-(4-morpholinophenyl)-1-butanone are preferred. The above-mentioned acetophenone compound (D-2) can be used alone or in combinations of two or more.

Examples of the other photoinitiator (D-3) include biimidazole compounds such as 2,2'-bis(o-chlorophenyl)-4,4',5,5'-tetraphenyl biimidazole, 2,2'-bis(o-fluorophenyl)-4,4',5,5'-tetraphenyl biimidazole, 2,2'-bis(o-methylphenyl)-4,4',5,5'-tetraphenyl biimidazole, 2,2'-bis(o-methoxyphenyl)-4,4',5,5'-tetraphenyl biimidazole, 2,2'-bis(p-methoxyphenyl)-4,4',5,5'-tetraphenyl biimidazole, 2,2'-bis(2,2',4,4'-tetramethoxyphenyl)-4,4',5,5'-tetraphenyl biimidazole, 2,2'-bis(2,2'-dichlorophenyl)-4,4',5,5'-tetraphenyl biimidazole and the like; benzophenone compounds such as thioxantone, 2,4-diethylthioxantone, thioxantone-4-sulphone, benzophenone, 4,4'-bis(dimethylamino)benzophenone, 4,4'-bis(diethylamino)benzophenone and the like; a-diketone compounds such as benzil, acetyl and the like; acyloin compounds such as benzoin and the like; acyloin ethers such as benzoin methyl ether, benzoin ethyl ether, benzoin isopropyl ether and the like; acylphosphine oxide compounds such as 2,4,6-trimethylbenzoyl diphenylphosphine oxide, bis-(2,6-dimethoxybenzoyl)-2,4,4-trimethyl benzylphosphine oxide and the like; quinone compounds such as anthraquinone, 1,4-naphthoquinone and the like; halide compounds such as phenacyl chloride, tribromomethyl phenylsulfone, tris(trichloromethyl)-s-triazine) and the like; peroxide compounds such as di-tert-butyl peroxide and the like; and any combination thereof. The above-mentioned other photoinitiator (D-3) can be used alone or in combinations of two or more.

Based on the total amount of the compound containing vinyl unsaturated group(s) (C) as 100 parts by weight, the amount of the photoinitiator (D) is 2 to 120 parts by weight, preferably 5 to 70 parts by weight, and more preferably 10 to 60 parts by weight.

Solvent (E)

It is preferable that the solvent (E) of the present invention evaporates properly, dissolves but not reacts with the alkali-soluble resin (A), the compound containing vinyl unsaturated group(s) (C) and the photoinitiator (D).

Examples of the aforementioned solvent (E) include alkylene glycol monoalkyl ethers such as ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether and the like; alkylene glycol monoalkyl ether acetates such as ethylene glycol monomethyl ether acetate, ethylene glycol monoethyl ether acetate, propylene glycol monomethyl ether acetate, propylene glycol monoethyl ether acetate and the like; other ethers such as diethylene glycol dimethyl ether, diethylene glycol methyl ethyl ether, diethylene glycol diethyl ether, tetrahydrofuran and the like; ketones such as methyl ethyl ketone, cyclohexanone, 2-heptanone, 3-heptanone, diacetone alcohol and the like; alkyl lactates such as methyl lactate, ethyl lactate and the like; other esters such as methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate, ethyl ethoxyacetate, ethyl hydroxyacetate, methyl 2-hydroxy-3-methylenebutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-oxybutyrate and the like; aromatic hydrocarbons such as toluene, xylene and the like; carboxylic amines such as N-methylpyrrolidone, N,N-dimethylformamide, N,N-dimethylacetamide and the like; and any combination thereof. The above-mentioned solvent (E) can be used alone or in combinations of two or more.

Based on the total amount of the alkali-soluble resin (A) as 100 parts by weight, the amount of the solvent (E) is 500 to 5,000 parts by weight, preferably 800 to 4,700 parts by weight, and more preferably 1,000 to 4,500 parts by weight.

Black Pigment (F)

It is suitable that the black pigment (F) of the present invention is resistant to heat, light and solvents.

Examples of the black pigment (F) include black organic pigment such as perylene black, cyanine black, aniline black and the like; organic near-black pigments mixed with at least two pigments selected from the group consisted of red, blue, green, purple, yellow, cyanine, magenta pigments and the like; light-shielding materials such as carbon black, chromium oxide, iron oxide, titanium black, graphite and the like. The carbon black can include but be not limited to C.I. pigment black 7 and the like, examples of which include MA100, MA230, MA8, #970, #1000, #2350, #2650, all commercially available from Mitsubishi Chemical Co. The above-mentioned black pigment (F) can be used alone or in combinations of two or more.

Based on the total amount of the alkali-soluble resin (A) as 100 parts by weight, the amount of the black pigment (F) is 50 to 800 parts by weight, preferably 50 to 750 parts by weight, and more preferably 100 to 700 parts by weight.

Light Stabilizer (G)

The light stabilizer (G) of the present invention preferably includes a UV absorber (G-1) and/or a hindered amine (G-2), the detail of which as follows.

UV Absorber (G-1)

The UV absorber (G-1) has a structure listed as Formula (III):

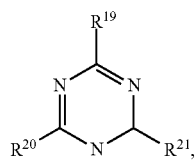
(III)

In Formula (III), $R^{19}$, $R^{20}$ and $R^{21}$ are the same or different from each other and each independently represents an organic group of with six to twenty-five carbon atoms. Examples of $R^{19}$, $R^{20}$ and $R^{21}$ are preferably listed in following Formulas (III-1) to (III-8):

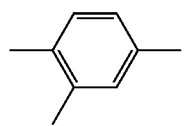
(III-1)

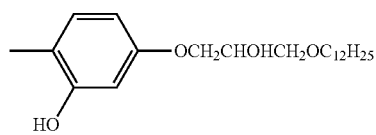
(III-2)

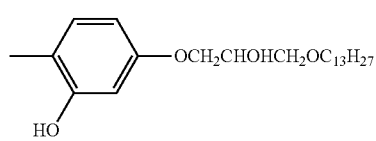
(III-3)

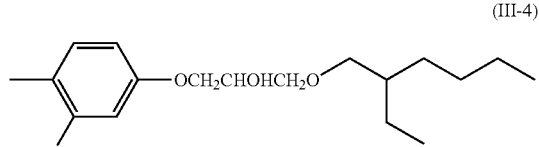
(III-4)

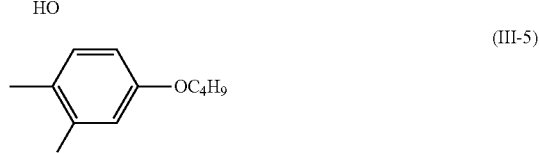
(III-5)

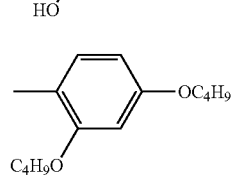
(III-6)

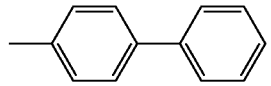
(III-7)

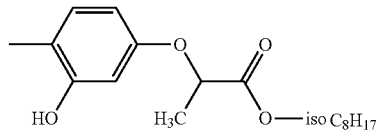
(III-8)

Moreover, the UV absorber (G-1) also has a structure listed as Formula (IV):

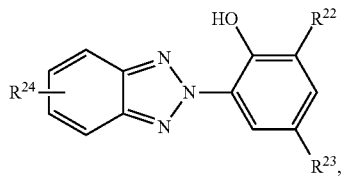
(IV)

In Formula (IV), $R^{22}$ and $R^{23}$ are the same or different from each other and each independently represents a hydrogen atom or an organic group of with one to thirty-five carbon atoms, and $R^{24}$ represents a hydrogen atom or a halogen atom. Examples of $R^{22}$ and $R^{23}$ are preferably listed in following Formulas (IV-1) to (IV-9):

—H  (IV-1)

—$CH_2CH_2COOC_8H_{17}$  (IV-2)

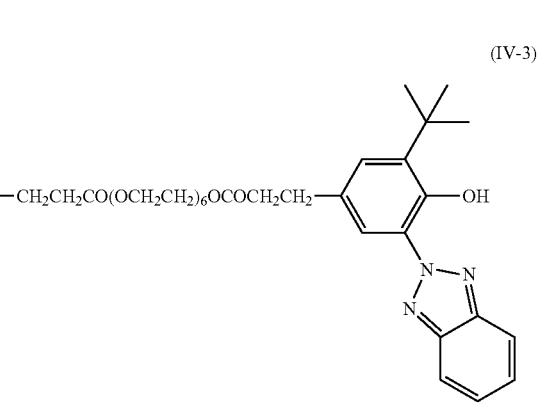
(IV-3)

(IV-4)

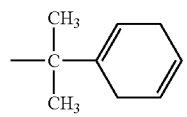 (IV-5)

—CH₂CH₂CO(OCH₂CH₂)₆OH (IV-6)

—CH₂CH₂CO(OCH₂CH₂)₇OH (IV-7)

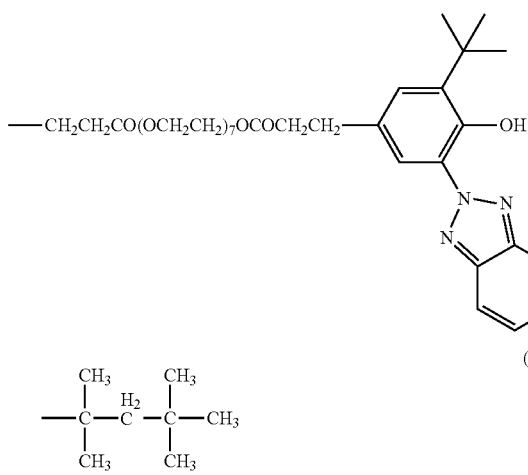 (IV-8)

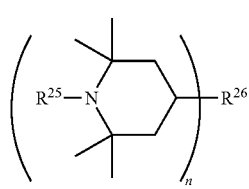 (IV-9)

Hindered Amine (G-2)

The hindered amine (G-2) has a structure listed as Formula (V):

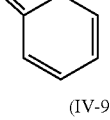 (V)

In Formula (V), $R^{25}$ and $R^{26}$ are the same or different from each other and each independently represents an organic group of with one to thirty carbon atoms, and n represents an integer of one to two. Examples of $R^{25}$ and $R^{26}$ preferably are listed in following Formulas (V-1) to (V-4):

—OC₈H₁₇ (V-1)

—CH₃ (V-2)

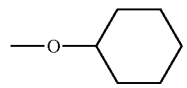 (V-3)

—OCO(CH₂)₈COOCH₃ (V-4)

When the n of the structure listed as Formula (V) is 2, examples of $R^{26}$ preferably listed in following Formulas (V-5) to (V-7):

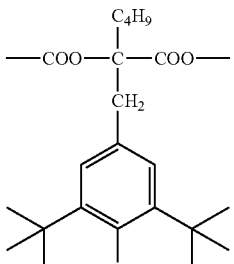 (V-5)

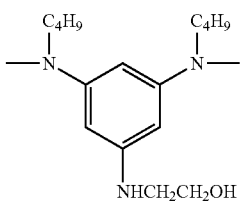 (V-6)

—OCO(CH₂)₈COO— (V-7)

The above-mentioned UV absorber (G-1) and/or the hindered amine (G-2) can be used alone or in combinations of two or more.

Among the examples of the UV absorber (G-1), 2-(2-hydroxy-4-[1-octyloxy carbonyl ethoxy]phenyl)-4,6-bis(4-phenylphenyl)-1,3,5-triazine (for example, the trade name TINUVIN®479, manufactured by Ciba Specialty Chemicals Co.) listed as Formula (V-8), 2-[4-[2-hydroxy-3-tridecyloxypropyl]oxy]-2-hydroxyphenyl)-4,6-bis(2,4-dimethyl phenyl)-1,3,5-triazine and 2-[4-[2-hydroxy-3-dodecyloxy propyl]oxy]-2-hydroxyphenyl)-4,6-bis(2,4-dimethylphenyl)-1,3,5-triazine (for example, the trade name TINUVIN®400, manufactured by BASF Co.) listed as Formulas (V-9) and (V-10), 2-(2H-benzotriazol-2-yl)-4,6-bis(1-methyl-1-phenylethyl)phenol (the trade name TINUVIN®900, manufactured by BASF Co.) listed as Formula (V-11), 2-[2-Hydroxy-4-[3-(2-ethylhexyl-1-oxy)-2-hydroxypropyloxy]phenyl]-4,6-bis(2,4-dimethylphenyl)-1,3,5-triazine (the trade name TINUVIN®405, manufactured by BASF Co.) listed as Formula (V-12) or any combination thereof can possess better weather resistance of the photosensitive resin composition of the present invention and its molded body hardened at the early stage.

(V-8)

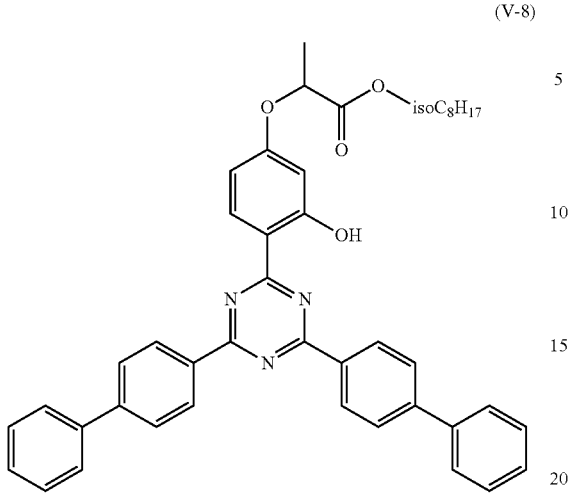

(V-11)

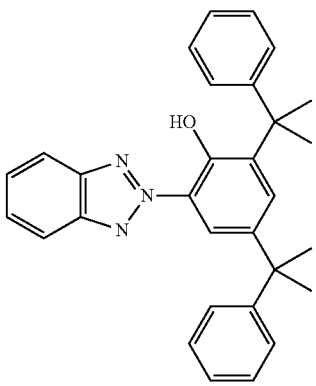

(V-9)

(V-12)

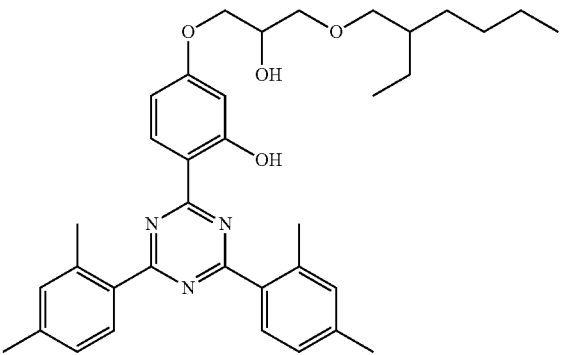

(V-10)

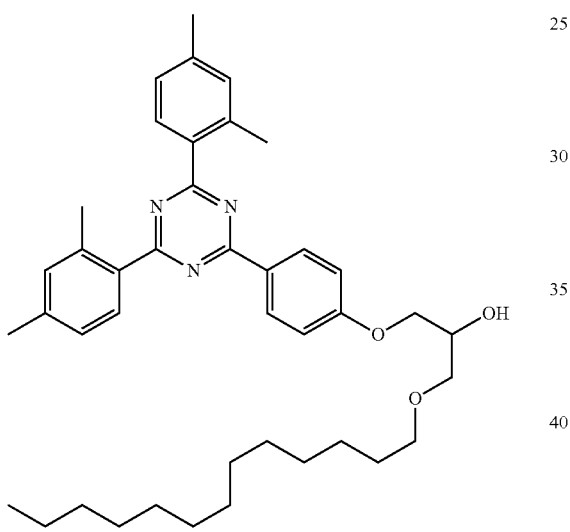

Among the examples of the hindered amine (G-2), 2,4-bis [N-Butyl-N-(1-cyclohexyloxy-2,2,6,6-tetramethylpiperidin-4-yl)amino]-6-(2-hydroxyethylamine)-1,3,5-triazine (the trade name TINUVIN®152, manufactured by Ciba Specialty Chemicals Co.) listed as Formula (V-13), the mixture of bis (1,2,2,6,6-pentamethyl-4-piperidinyl)sebacate listed as Formula (V-14) and 1-(methyl)-8-(1,2,2,6,6-pentamethyl-4-piperidinyl)sebacate (the trade name TINUVIN®292, manufactured by Ciba Specialty Chemicals Co.) listed as Formula (V-15), bis-(1-octyloxy-2,2,6,6-tetramethyl-4-piperidinyl)sebacate (the trade name TINUVIN®123, manufactured by Ciba Specialty Chemicals Co.) listed as Formula (V-16), bis(2,2,6,6-tetramethyl-4-piperidyl)sebacate (the trade name TINUVIN®770DF, manufactured by Ciba Specialty Chemicals Co.) listed as Formula (V-17), or any combination thereof can also possess better weather resistance of the photosensitive resin composition of the present invention and its molded body at the early stage.

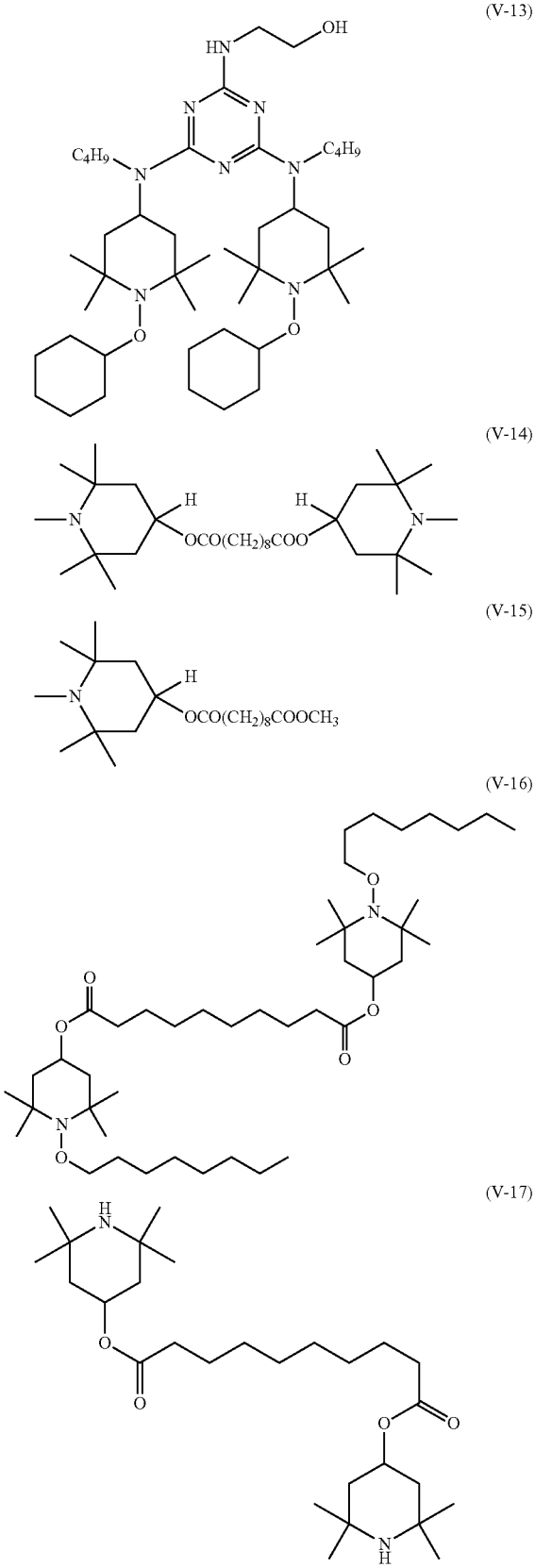

Based on the total amount of the alkali-soluble resin (A) as 100 parts by weight, the amount of the light stabilizer (G) is 0.1 to 5.0 parts by weight, preferably 0.5 to 4.5 parts by weight, and more preferably 1.0 to 4.0 parts by weight. The resulted photosensitive resin composition would have disadvantages such as worse temporal stability if it totally included no the light stabilizer (G).

Additive (H)

In consideration of no substantially adverse influence of the present invention, the aforementioned photosensitive resin composition optionally includes an additive (H) that includes but is not limited to a surfactant, a filling agent, an adhesiveness improver, a crosslinking agent, an antioxidant, an anti-agglutinating agent, other polymer for improving various functions (for example, mechanical properties) except from the alkali-soluble resin (A) and the like.

Examples of the surfactant can include but are not limited to cationic, anionic, nonionic, zwitterionic, polysiloxane, fluorine surfactants and any combination thereof. More specifically, examples of the surfactant can include but are not limited to polyoxyethylene allyl ethers such as polyoxyethylene dodecyl ether, polyoxyethylene stearamide ether, polyoxyethylene oleyl ether and the like; polyoxyethylene allyl phenyl ethers such as polyoxyethylene octyl phenyl ether, polyoxyethylene nonyl phenyl ether and the like; polyethylene glycol diesters such as polyethylene glycol dilaurate, polyethylene glycol distearate and the like; sorbitan fatty acid esters; fatty acid-modified polyesters; and tertiary amine-modified polyurethanes. The above-mentioned surfactant can be used alone or in combinations of two or more.

Suitable examples of the surfactants include the trade names such as KP (manufactured by SHIN-ETSU CHEMICAL Co. Ltd.), SF-8427 (manufactured by TORAY DOW CORNING SILICON Co., Ltd.), Polyflow (manufactured by KYOEISHA CHEMICAL Co., Ltd.), F-Top (manufactured by TOCHEM PRODUCT Co., Ltd.), Megafac (manufactured by DAINIPPON INK AND CHEMICALS Inc.), Fluorade (manufactured by SUMITOMO 3M Ltd.), Asahi Guard, Surflon (manufactured by ASAHI GLASS Co., Ltd.) or SINOPOL E8008 (manufactured by SINO-JAPAN CHEMICAL CO., Ltd.) and the like.

Suitable examples of the filling agent can include glass, aluminum and the like.

Examples of the adhesiveness improver can include vinyltrimethoxysilane, vinyltriethoxysilane, vinyl tris(2-methoxyethoxy)silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyldimethoxysilane, 3-glycidoxypropyl methyl diethoxysilane, 2-(3,4-epoxycyclohexyl)ethyl trimethoxysilane, 3-chloro propylmethyldimethoxysilane, 3-chloropropyltrimethoxysilane, 3-methacryloxy propyl trimethoxysilane, 3-mercaptopropyl trimethoxysilane and the like.

Examples of the antioxidant can include but are not limited to 2,2'-thio-bis(4-methyl-6-t-butylphenol) or 2,6-di-t-butylphenol and the like.

Examples of the anti-agglutinating agent can include but are not limited to sodium polyacrylate and the like.

Examples of the crosslinking agent can include but are not limited to epoxy compounds or resins, such as 1031S, 157S-70 (manufactured by Japan Epoxy Resins Co., Ltd.).

Based on the total amount of the alkali-soluble resin (A) as 100 parts by weight, an amount of the additive (H), such as the filling agent, the adhesiveness improver, the antioxidant, the anti-agglutinating agent or the other polymer for improving various functions except from the alkali-soluble resin (A), is typically less than 10 parts by weight, preferably less than 6 parts by weight.

Based on the total amount of the alkali-soluble resin (A) as 100 parts by weight, an amount of the additive (H) such as the surfactant is typically less than 6 parts by weight, preferably less than 4 parts by weight.

Based on the total amount of the alkali-soluble resin (A) as 100 parts by weight, an amount of the additive (H) such as the crosslinking agent is typically less than 100 parts by weight, preferably less than 80 parts by weight.

Preparation of Photosensitive Resin Composition

The photosensitive resin composition of the present invention can be prepared by mixing the alkali-soluble resin (A), the polysiloxane polymer (B), the compound containing vinyl unsaturated group(s) (C), the photoinitiator (D), the solvent (E), the black pigment (F) and the light stabilizer (G) are mixed well in a mixer until all components are formed into a solution state. The photosensitive resin composition is optionally added with the surfactant, the filling agent, the adhesiveness improver, the crosslinking agent, the antioxidant, the anti-agglutinating agent and the like as necessary.

Based on the total amount of the alkali-soluble resin (A) as 100 parts by weight, the amount of the resin having unsaturated group(s) (A-1) is 30 to 100 parts by weight, the amount of the polysiloxane polymer (B) is 5 to 150 parts by weight, preferably 7 to 130 parts by weight, the amount of the compound containing vinyl unsaturated group(s) (C) is 5 to 220 parts by weight, the amount of the solvent (E) is 500 to 5,000 parts by weight, the amount of the black pigment (F) is 50 to 800 parts by weight, and the amount of the light stabilizer (G) is 0.1 to 5.0 parts by weight. Moreover, based on the total amount of the compound containing vinyl unsaturated group(s) (C) as 100 parts by weight, the amount of the photoinitiator (D) is 2 to 120 parts by weight.

Furthermore, there are no limitations specific to the preparation of the photosensitive resin composition. For example, the black pigment (F) can be directly added into and dispersed in the photosensitive resin composition. Alternatively, a pigment dispersion can be prepared by dispersing the black pigment (F) in a medium of a part of the alkali-soluble resin (A) and the solvent (E), and then it is mixed with the polysiloxane polymer (B), the compound containing vinyl unsaturated group(s) (C), the photoinitiator (D), and the remaining part of the alkali-soluble resin (A) and the solvent (E), so as to obtain the photosensitive resin composition. During the dispersion of the black pigment (F), all components can be mixed well by a mixer such as a beads mill, a roll mill or the like.

Method of Forming Black Matrix

The photosensitive resin composition of the present invention can be subjected to a prebake step, an exposure step, a development step and a postbake step, so as to forming black matrix on a substrate. When the black matrix is formed with a film thickness of 1 μm by the photosensitive resin composition, the black matrix has an optical density more than 3.0, preferably an optical density of 3.2 to 5.5, and more preferably 3.5 to 5.5.

Specifically, during the formation of the black matrix, the photosensitive resin composition can be applied on the substrate by various coating methods, for example, spin coating, cast coating or roll coating methods. And then, the coated resin composition is dried under reduced pressure and prebaked to remove the solvent, thereby forming a prebaked and coated film. The step of dehydration under reduced pressure and prebake is carried out in various conditions, for example, dehydration under reduced pressure of less than 200 mmHg for 1 to 20 seconds, and prebake at 70 to 110° C. for 1 to 15 minutes, which depend upon the kinds and the mixing ratio of components. After the prebake step, the prebaked and coated film is exposed under a given mask, and then immersed in a developing solution at 23±2° C. for 15 seconds to 5 minutes, thereby removing undesired areas and forming a given pattern. The exposure light is preferably UV light such as g-line, h-line, i-line and so on, which may be generated by a UV illumination device such as (super) high-pressure mercury lamp or metal halide lamp.

Specific examples of the developing solution include but are not limited to alkaline compounds such as sodium hydroxide, potassium hydroxide, sodium carbonate, sodium hydrogen carbonate, potassium carbonate, potassium hydrogen carbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabi-cyclo-[5,4,0]-7-undecene and the like. The concentration of the developing solution is preferably 0.001 weight percent (wt %) to 10 wt %, more preferably 0.005 wt % to 5 wt %, and much more preferably 0.01 wt % to 1 wt %.

When the aforementioned alkaline compounds are included in the developing solution, the coated film can be washed by water after being developed, and then be dried by using compressed air or nitrogen gas. Next, a hot plate, an oven or other heating device is used to postbake the coated film. The postbake step can be carried out at 150° C. to 250° C. for 5 to 60 minutes on the hot plate or for 15 to 150 minutes in the oven. After those steps, the black matrix is formed on the substrate.

Specific examples of the aforementioned substrate include but are not limited to alkali-free glass, Na—Ca glass, hard glass (Pyrex glass) and a quartz glass utilized in the LCD, and those having an electrically conductive transparent film disposed thereon; a substrate of light-to-electricity conversion (for example, silicone substrate) utilized in solid-camera device and the like.

Method of Producing Color Filter

The method of producing a color filter (CF) is based on the aforementioned method of forming the black matrix. Similarly, a solution state of the photosensitive resin composition for a color filter is applied on a substrate by various coating methods, for example, spin coating, cast coating or roll coating methods, for forming a colored photosensitive layer, in which the aforementioned substrate has the black matrix formed thereon for separating each pixel region. After removal of most solvent in the photosensitive resin composition for the color filter by using low-pressure dehydration, a prebake treatment is further subjected to the photosensitive resin composition for removing the remaining solvent and forming a prebaked coating film. The low-pressure dehydration and the prebake treatment are carried out in various conditions, which depend upon the kinds and the mixing ratio of components. Typically, the low-pressure dehydration is carried out under a pressure of 0 mmHg to 200 mmHg for 1 second to 60 seconds, and the prebake treatment is carried out under 70° C. to 110° C. for 1 minute to 15 minutes. After the prebake treatment, the prebaked coating film is exposed under the given mask, and then developed in a developer under 23±2° C. for 15 seconds to 5 minutes, thereby removing undesired areas and forming a given pattern. The exposure light is preferably UV light such as g-line, h-line, i-line and so on, which may be generated by a UV illumination device such as (super) high-pressure mercury lamp or metal halide lamp. After being developed and washed, the given pattern is dried by using compressed air or nitrogen gas. Next, a hot plate, an oven or other heating device is used to postbake the coated film. The postbake step can be carried out in the above-mentioned conditions without reciting them in detail again.

Each pixel layer (including three primary colors of red, green and blue colors) of the color filter can be made by repeating the above-mentioned steps. Moreover, an evaporated indium-tin oxide (ITO) film can be formed on the pixel layer under 220° C. to 250° C. in a vacuum environment. After the evaporated ITO film can be etched and wired, if necessary, a polyimide for a LC alignment film can be coated on the evaporated ITO film and burnt, resulting in the color filter for a LCD device.

LCD Device

The LCD device of the present invention comprises the color filter substrate formed by the aforementioned method and a TFT array substrate (driver substrate). The aforementioned TFT array substrate (driver substrate) and the color filter (CF) substrate are disposed oppositely, spacers (or called as cell gaps) are disposed there between and the edges of the two substrates are adhered by a curing agent for forming a space. LC material is filled into the space through a sealing hole, and the sealing hole is sealed to form a LC cell. And then, a polarizer is adhered onto one side or both sides of the LC cell, so as to assemble the LCD device.

The aforementioned LC material can be any prior LC compound or composition without any limitation.

Furthermore, the LC alignment film can be any inorganic or organic substance for restriction of the orientation of the LC molecules but no further specific limitation thereto the LC alignment film. The method of forming LC alignment film can be carried out by any widely known method rather than focusing or mentioning them in details.

Thereinafter, various applications of the present invention will be described in more details referring to several exemplary embodiments below, while not intended to be limiting. Thus, one skilled in the art can easily ascertain the essential characteristics of the present invention and, without departing from the spirit and scope thereof, can make various changes and modifications of the invention to adapt it to various usages and conditions.

BRIEF DESCRIPTION OF THE DRAWINGS

No drawings.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

EXAMPLES

Synthesis Example 1

Method of Synthesizing Resin Having Unsaturated Group(s) (A-1-1)

The components comprising 100 parts by weight of the fluorine compound containing epoxy group(s) (trade name ESF-300, manufactured by NIPPON STEEL CHEMICAL Co., Ltd.; epoxy equivalent per weight: 231), 30 parts by weight of the acrylic acid, 0.3 parts by weight of the benzyltriethylammonium chloride, 0.1 parts by weight of the 2,6-di-t-butyl-p-cresol and 130 parts by weight of the propylene glycol methyl ether acetate were continuously charged to a 500 mL four-necked conical flask, in a feeding speed of 25 parts by weight per minute under 100° C. to 110° C. to polymerize for 15 hours. After the reaction was completed, a yellowish clear mixed solution with 50 wt % of solid content was obtained.

Next, 100 parts by weight of the resulted yellowish clear mixed solution was dissolved in 25 parts by weight of ethylene glycol monoethyl ether acetate, where 6 parts by weight of tetrahydrophthalic anhydride and 13 parts by weight of benzophenone tetracarboxylic dianhydride (BTDA) were also added thereto, followed by heating the reaction to 110° C. to 115° C. for 2 hours, thereby obtaining the resin having unsaturated group(s) (A-1-1) with acid value of 98.0 mg KOH/g.

Synthesis Example 2

Method of Synthesizing Resin Having Unsaturated Group(s) (A-1-2)

The components comprising 100 parts by weight of the fluorine compound containing epoxy group(s) (trade name ESF-300, manufactured by NIPPON STEEL CHEMICAL Co., Ltd.; epoxy equivalent per weight: 231), 30 parts by weight of the acrylic acid, 0.3 parts by weight of the benzyltriethylammonium chloride, 0.1 parts by weight of the 2,6-di-t-butyl-p-cresol and 130 parts by weight of the propylene glycol methyl ether acetate were continuously charged to a 500 mL four-necked conical flask, in a feeding speed of 25 parts by weight per minute under 100° C. to 110° C. to polymerize for 15 hours. After the reaction was completed, a yellowish clear mixed solution with 50 wt % of solid content was obtained.

Next, 100 parts by weight of the resulted yellowish clear mixed solution was dissolved in 25 parts by weight of ethylene glycol monoethyl ether acetate, where 13 parts by weight of tetrahydrophthalic anhydride, for reacting under 90° C. to 95° C. for 2 hours. And then, and 6 parts by weight of tetrahydrophthalic anhydride were added to the above-mentioned reactant, followed by heating the reaction to 90° C. to 95° C. for 4 hours, thereby obtaining the resin having unsaturated group(s) (A-1-2) with acid value of 99.0 mg KOH/g.

Synthesis Example 3

Method of Synthesizing Resin Having Unsaturated Group(s) (A-1-3)

The components comprising 400 parts by weight of the epoxy compound (trade name NC-3000, manufactured by NIPPON KAYAKU Co., Ltd.; epoxy equivalent per weight: 228), 102 parts by weight of the acrylic acid, 0.3 parts by weight of the methoxyphenol, 5 parts by weight of the triphenyl phosphine and 264 parts by weight of the propylene glycol methyl ether acetate were continuously charged to the flask as above-mentioned, for reacting under 95° C. to polymerize for 9 hours. After the reaction was completed, an intermediate product with acid value of 2.2 mg KOH/g was obtained. Next, the resulted intermediate product was added with 151 parts by weight of tetrahydrophthalic anhydride, for reacting under 95° C. for 4 hours, thereby obtaining the resin having unsaturated group(s) (A-1-3) with acid value of 102 mg KOH/g and averaged molecular weight of 3,200.

Synthesis Example 4

Method of Synthesizing Other Alkali-Soluble Resin (A-2-1)

The components comprising 1 parts by weight of 2,2'-azobis(isobutyronitrile), 240 parts by weight of the propylene glycol monomethyl ether acetate, 20 parts by weight of the methacrylic acid, 15 parts by weight of the styrene, 35 parts by weight of methyl methacrylate, 10 parts by weight of glycerol monomethacrylate and 20 parts by weight of N-phenyl maleimide were continuously charged to a round-bottom flask that was equipped with a stirrer and a condenser and purged with nitrogen gas. Next, the reaction solution was slowly stirred and heated to 80° C. to polymerize for 4 hours. Afterward, the reaction solution was further heated to 100° C. and added with 0.5 parts by weight of 2,2'-azobis(isobutyronitrile) to polymerize for 1 hour, thereby obtaining the other alkali-soluble resin (A-2-1).

Synthesis Example 5

Method of Synthesizing Other Alkali-Soluble Resin (A-2-2)

The components comprising 2 parts by weight of 2,2'-azobis(isobutyronitrile), 15 parts by weight of the methacrylic acid, 15 parts by weight of ethyl 2-hydroxyacrylate and 70 parts by weight of benzyl methacrylate were continuously charged to a round-bottom flask that was equipped with a stirrer and a condenser and purged with nitrogen gas. Next, the reaction solution was slowly stirred and heated to 80° C. to polymerize for 3 hours. Afterward, the reaction solution was further heated to 100° C. and added with 0.5 parts by weight of 2,2'-azobis(isobutyronitrile) to polymerize for 1 hour, thereby obtaining the other alkali-soluble resin (A-2-2).

Synthesis Example 6

Method of Synthesizing Polysiloxane Polymer (B-1)

100 g of propylene glycol monoethyl ether was charged to a 500 mL three-necked flask, stirred under room temperature and continuously added with a silane monomer mixed solution and oxalic acid solution. The aforementioned silane monomer mixed solution included comprising 84 g (0.7 mole) of dimethyldimethoxysilane (DMDMS) and 59.4 g (0.3 mole) of phenyltrimethoxysilane (PTMS) dissolved in 80 g of propylene glycol monoethyl ether, and the aforementioned oxalic acid solution included 0.15 g of oxalic acid dissolved in 30 g of water. Next, the flask was immersed in an oil bath of 30° C. and the reaction solution was stirred for 30 minutes, followed by heating the oil bath to 120° C. for no more than 30 minutes. When the reactant solution had an inner temperature up to 105° C., the reactant solution was heated and stirred to polycondense for 2 hours, thereby obtaining the polysiloxane polymer (B-1). Some by-products such as 73 g of methanol and 16 g of water were distilled out of the reaction solution.

Synthesis Example 7

Method of Synthesizing Polysiloxane Polymer (B-2)

78.0 (0.65 mole) g of the DMDMS, 63.4 g (0.32 mole) of the PTMS, 9.1 g (0.03 mole) of the 3-triethoxysilyl propyl butanedioic anhydride (the trade name GF-20) and 200 g of the propylene glycol monoethyl ether were charged to a 500 mL three-necked, stirred under room temperature and continuously added with oxalic solution (0.25 g of oxalic acid per 75 g of water; 0.25 g of oxalic acid/75 g $H_2O$) for no more than 30 minutes. Next, the flask was immersed in an oil bath of 30° C. and the reactant was stirred for 30 minutes, followed by heating the oil bath to 100° C. for no more than 30 minutes. When the reactant solution had an inner temperature up to 100° C., the reactant solution was heated and stirred to polycondense for 5 hours. When the reactant solution was cooled down to room temperature, added with 2000 g of acetone and stirred for 30 minutes. After the precipitate was filtrated off and the solvent was removed by distillation, thereby obtaining polysiloxane polymer (B-2).

Synthesis Example 8

Method of Synthesizing Polysiloxane Polymer (B-3)

100 g of propylene glycol monoethyl ether was charged to a 500 mL three-necked flask, stirred under room temperature and continuously added with a silane monomer mixed solution and oxalic acid solution. The aforementioned silane monomer mixed solution included comprising 81.6 g (0.6 mole) of methyl trimethoxysilane and 79.2 g (0.4 mole) of PTMS dissolved in 80 g of propylene glycol monoethyl ether, and the aforementioned oxalic acid solution included 0.10 g of oxalic acid dissolved in 30 g of water. Next, the flask was immersed in an oil bath of 30° C. and the reaction solution was stirred for 30 minutes, followed by heating the oil bath to 120° C. for no more than 30 minutes. When the reactant solution had an inner temperature up to 105° C., the reactant solution was heated and stirred to polycondense for 2 hours, thereby obtaining polysiloxane polymer (B-3). By-products such as 96 g of methanol and 24 g of water were distilled out of the reaction solution.

Method of Manufacturing Photosensitive Resin Composition

The following examples are directed to the preparation of the photosensitive resin composition of Examples 1 to 12 and Comparative Examples 1 to 7 according to TABLE 1.

Example 1

100 parts by weight of the resin having unsaturated group(s) (A-1-1) of Synthesis Example 1, 10 parts by weight of the polysiloxane polymer (B-1) of Synthesis Example 6, 30 parts by weight of dipentaerythritol hexaacrylate (C-1), parts by weight of ethanone, 1-[9-ethyl-6-(2-methylbezoyl)-9H-carbozole-3-yl]-1-(O-acetyl oxime) (the trade name OXE02, manufactured by Ciba Specialty Chemicals Co.; D-1), 150 parts by weight of the C.I. pigment black 7 (the trade name MA100, manufactured by Mitsubishi Chemical Co.; F-1), 0.1 parts by weight of TINUVIN®400 (manufactured by BASF Co.) and propylene glycol monomethyl ether acetate (E-1) were stirred and mixed well in a shaking mixer, so as to form a solution state of a photosensitive resin composition of Example 1. And then, the properties of the photosensitive resin composition were determined by using the following evaluation methods and resulted in TABLE 1. The detection methods were described as follows.

Examples 2 to 12 and Comparative Examples 1 to 7

Examples 2 to 9 and Comparative Examples 1 to 7 were practiced with the same method as in Example 1 by using various kinds or usage of the components. The formulation, the amount of the components and the evaluation results were listed in TABLE 1 (Examples 1 to 12) and TABLE 2 (Comparative Examples 1 to 7) rather than focusing or mentioning them in details.

Method of Manufacturing Black Matrix

The following examples are directed to the preparation of the photosensitive resin composition of Examples 1 to 12 and Comparative Examples 1 to 7 according to TABLE 1.

Application Example 1

The photosensitive resin composition of Example 1 was coated unto a glass substrate (100 mm×100 mm) by a spin-coater (Opticoat MS-A150, MIKASA. Co., Tokyo, Japan). And then, the coated resin composition was dehydration under reduced pressure of 100 mmHg for 5 seconds and prebaked in an oven at 85° C. for 3 minutes, so as to form a prebaked and coated film with a thickness of about 2.2 µm.

Next, the prebaked and coated film was exposed under a given mask by using UV light (AG500-4N; manufactured by M&R Nano Technology) in 200 mJ/cm², immersed in a developing solution (0.04% potassium hydroxide) at 23° C. for 2 minutes, washed by water, and then postbaked at 200° C. for 40 minutes, thereby forming a black matrix with a thickness of 2.0 µm. The resulted black matrix was evaluated by the following methods and the results were listed as TABLE 1.

Application Examples 2 to 12 and Comparative Application Examples 1 to 7

The black matrixes of Application Examples 2 to 9 and Comparative Application Examples 1 to 7 were practiced with the same method as in Application Example 1 by using various kinds or usage of the components. The formulation, the amount of the components and the evaluation results were listed in TABLE 1 (Application Examples 1 to 12) and TABLE 2 (Comparative Application Examples 1 to 7) rather than focusing or mentioning them in details.

Evaluation Methods

The temporal stability and the thermal resistance of the above-mentioned photosensitive resin compositions and the black matrixes (or called as the shielding layers) by using the same were assessed by using the following evaluation methods under low-luminance of the exposure condition.

1. Temporal Stability

The photosensitive resin compositions of EXAMPLES 1 to 12 and COMPARATIVE EXAMPLES 1 to 7 were put under 25° C. for one month, and the viscosities of the resin compositions before and after the treatment were measured to calculate the viscosity changing ratio according to Formula (VIII), thereby evaluating the temporal stability according to the following conditions.

$$\text{Viscosity Changing Ratio}=|\mu_0-\mu_1|/\mu_0\times 100\% \quad \text{(VIII)}$$

$\mu_0$: initial viscosity
$\mu_1$: temporal viscosity after one month
○: viscosity changing ratio≤5%
Δ: 5%<viscosity changing ratio≤8%
x: 8%<viscosity changing ratio 2. Thermal Resistance The prebaked and coated films of EXAMPLES 1 to 12 and COMPARATIVE EXAMPLES 1 to 7 were measured by using the high resistivity meter (Hiresta UP Model MCP-HT450, manufactured by Mitsubishi Chemical Co,). Averaged surface resistances ($\Omega_1$) were obtained from three different detection sites of the prebaked and coated films that were chosen and measured by the high resistivity meter.

Next, the prebaked and coated films were exposed under a given mask by using UV light in 100 mJ/cm², immersed in a developing solution (0.04% potassium hydroxide) at 23° C. for 2 minutes, washed by water, and then postbaked at 280° C. for 60 minutes, thereby forming a black matrix with a thickness of 1.0 µm. Another averaged surface resistances ($\Omega_2$) were obtained from same three detection sites as aforementioned were measured again by the high resistivity meter to evaluate the surface resistance stability ($R_H$) according to Formula (IX), thereby evaluating the thermal resistance according to the following conditions.

$$\text{Surface Resistance Stability}(R_H)=[(\Omega_2/\Omega_1)]\times 100\% \quad \text{(IX)}$$

◎: 97%<$R_H$
○: 95%<$R_H$≤97%
Δ: 90%<$R_H$≤95%
x: $R_H$≤90%

According to the results of Examples 1 to 12 listed in TABLE 1, the resulted photosensitive resin compositions will exhibit excellent temporal stability and form the prebaked and coated films with better thermal resistance if such resin compositions include specific amounts of the resin having unsaturated group(s) (A-1), the polysiloxane polymer (B), the compound containing vinyl unsaturated group(s) (C), the solvent (E), the black pigment (F) and the light stabilizer (G), as well as the specific weight ratio [(A-1)/(B)] of the resin having unsaturated group(s) (A-1) to the polysiloxane polymer (B), thereby achieving the purpose of the present invention. In comparison, the temporal stability and the thermal resistance of the resin layer of Comparative Examples 1 to 7 as listed in TABLE 2 are worse. Furthermore, it is necessarily supplemented that, specific compounds, specific compositions, specific reaction conditions, specific processes, specific evaluation methods or specific instruments are employed as exemplary embodiments in the present invention, for illustrating the photosensitive resin composition and the color filter by using the same in the present invention. However, as is understood by a person skilled in the art, the positive photosensitive resin composition and the method for forming patterns by using the same in the present invention can include other compounds, other compositions, other reaction conditions, other processes, other evaluation methods or other instruments rather than limiting to the aforementioned examples.

As is understood by a person skilled in the art, the foregoing preferred embodiments of the present invention are illustrated of the present invention rather than limiting of the present invention. In view of the foregoing, it is intended to cover various modifications and similar arrangements included within the spirit and scope of the appended claims. Therefore, the scope of which should be accorded the broadest interpretation so as to encompass all such modifications and similar structure.

TABLE 1

| Components | | | EXAMPLES | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 | 12 |
| Alkali-soluble resin (A) (parts by weight) | A-1 | A-1-1 | 100 | | | 100 | | 80 | | | | 100 | | 90 |
| | | A-1-2 | | 100 | | | 100 | | 30 | | 100 | | 70 | |
| | | A-1-3 | | | 100 | | | | | 50 | | | | |
| | A-2 | A-2-1 | | | | | | 20 | 70 | | | | 30 | |
| | | A-2-2 | | | | | | | | 50 | | | | 10 |
| Polysiloxane polymer (B) (parts by weight) | B-1 | | | 10 | | | 60 | 50 | | 5 | | 5 | | 5 |
| | B-2 | | | 20 | | | 50 | | | 20 | 150 | | 60 | |
| | B-3 | | | | 40 | | | 80 | | | | | 60 | |
| Compound containing vinyl unsaturated group(s) (C) (parts by weight) | C-1 | | 30 | 60 | 30 | 100 | 100 | 200 | 30 | 60 | 100 | 30 | 100 | 30 |
| | C-2 | | | | 5 | | 20 | | | | 30 | | 50 | |
| Photo initiator (D) (parts by weight) | D-1 | | 10 | 20 | 10 | 40 | 60 | 30 | 5 | 20 | 30 | 10 | 35 | 5 |
| | D-2 | | | | 5 | | 5 | | 5 | 10 | 20 | | 5 | |
| Solvent (E) (parts by weight) | E-1 | | 2000 | 2000 | 2200 | 2500 | 3000 | 3000 | 2500 | 2500 | 4000 | 1500 | 3000 | 2000 |
| | E-2 | | | 500 | | | | 1000 | | 500 | 500 | | | |
| Black pigment (F) (parts by weight) | F-1 | | 150 | | 300 | 500 | 600 | 500 | 300 | | 800 | | 600 | 500 |
| | F-2 | | | 600 | 50 | | 100 | | 200 | 50 | | 300 | 50 | |
| Light stabilizer (G) (parts by weight) | G-1 | G-1-1 | 0.1 | | | 0.5 | | 1.0 | | | 2.0 | | | |
| | | G-1-2 | | | 1.0 | 0.5 | | | | 3.0 | | | | |
| | | G-1-3 | | | | | | | 5.0 | | | | 0.2 | |
| | G-2 | G-2-1 | | 0.5 | | | | 1.0 | | | | | | 1.0 |
| | | G-2-2 | | | | | 2.0 | | | | | | | 1.0 |
| | | G-2-3 | | | | | | | | | | 0.3 | | |
| Weight raio [(A-1)/(B)] of the resin having unsaturated group(s) (A-1)/polysiloxane polymer (B) | | | 10.00 | 5.00 | 2.50 | 1.67 | 1.00 | 1.00 | 6.00 | 2.50 | 0.67 | 20.00 | 0.58 | 18.00 |
| Parameters of Evalution | Temporal Stability | | ○ | ○ | ○ | ○ | ○ | ○ | ○ | ○ | ○ | ○ | ○ | ○ |
| | Thermal Resistance | | ◎ | ◎ | ◎ | ◎ | ◎ | ◎ | ◎ | ◎ | ○ | ○ | ○ | ○ |

TABLE 2

| Components | | | COMPARATIVE EXAMPLES | | | | | | |
|---|---|---|---|---|---|---|---|---|---|
| | | | 1 | 2 | 3 | 4 | 5 | 6 | 7 |
| Alkali-soluble resin (A) (parts by weight) | A-1 | A-1-1 | 100 | | | | | | |
| | | A-1-2 | | | | 100 | | | |
| | | A-1-3 | | | | | | 100 | |
| | A-2 | A-2-1 | | | 100 | | 100 | | 100 |
| | | A-2-2 | | | | 100 | | | |
| Polysiloxane polymer (B) (parts by weight) | B-1 | | | | | | | 50 | |
| | B-2 | | | | 40 | | 50 | | |
| | B-3 | | | | | | | | |
| Compound containing vinyl unsaturated group(s) (C) (parts by weight) | C-1 | | | 60 | 50 | 60 | 60 | 40 | 100 |
| | C-2 | | | | 10 | | | | |
| Photo initiator (D) (parts by weight) | D-1 | | | 20 | 15 | 20 | 20 | 10 | 30 |
| | D-2 | | | | 5 | | | | 5 |
| Solvent (E) (parts by weight) | E-1 | | | 3000 | 3000 | 2500 | 3000 | 4000 | 3000 |
| | E-2 | | | | | 500 | | | 500 |
| Black pigment (F) (parts by weight) | F-1 | | | 300 | 300 | 200 | 600 | 500 | 500 |
| | F-2 | | | | | 300 | | | |
| Light stabilizer (G) (parts by weight) | G-1 | G-1-1 | 0.2 | | | | | | |
| | | G-1-2 | | | | 0.5 | | | |
| | | G-1-3 | | | | | | | |
| | G-2 | G-2-1 | | | | 1.0 | | | |
| | | G-2-2 | | | | | | | |
| | | G-2-3 | | | | | | | |
| Weight raio [(A-1)/(B)] of the resin having unsaturated group(s) (A-1)/ polysiloxane polymer (B) | | | — | 0.00 | — | 2.00 | 0.00 | — | — |

TABLE 2-continued

|  | | COMPARATIVE EXAMPLES | | | | | | |
|---|---|---|---|---|---|---|---|---|
| Components | | 1 | 2 | 3 | 4 | 5 | 6 | 7 |
| Parameters of Evalution | Temporal Stability | Δ | Δ | Δ | X | X | X | X |
| | Thermal Resistance | X | X | X | Δ | X | X | X |

C-1 dipentaerythritol hexaacrylate
C-2 dipentaerythritol tetraacrylate
D-1 ethanone, 1-[9-ethyl-6-(2-methylbezoyl)-9H-carbozole-3-yl]-1-(O-acetyl oxime) (the trade name OXE02, manufactured by Ciba Specialty Chemicals Co.)
D-2 2-benzyl-2-N,N-dimethylamino-1-(4-morpholinophenyl)-1-butanone (the trade name IRGACURE 369, manufactured by Ciba Specialty Chemicals Co.)
E-1 propylene glycol monomethyl ether acetate
E-2 ethyl 3-ethoxypropanoate
F-1 MA100 (manufactured by Mitsubishi Chemical Co.)
F-2 MA230 (manufactured by Mitsubishi Chemical Co.)
G-1-1 TINUVIN ®400 (manufactured by BASF Co.)
G-1-2 TINUVIN ®900 (manufactured by BASF Co.)
G-1-3 TINUVIN ®405 (manufactured by BASF Co.)
G-2-1 TINUVIN ®292 (manufactured by BASF Co.)
G-2-2 TINUVIN ®123 (manufactured by BASF Co.)
G-2-3 TINUVIN ®770DF (manufactured by BASF Co.)

What is claimed is:

1. A photosensitive resin composition, comprising:
an alkali-soluble resin (A), wherein the alkali-soluble resin (A) includes a resin having unsaturated group(s) (A-1), and the resin having unsaturated group(s) (A-1) is obtained by reacting a mixture that includes an epoxy compound having at least two epoxy groups (a-1) with a compound having at least one vinyl unsaturated group and carboxyl group (a-2);
a polysiloxane polymer (B), wherein a weight ratio [(A-1)/(B)] of the resin having unsaturated group(s) (A-1) and the polysiloxane polymer (B) is 0.8 to 10.0, based on 100 parts by weight of the alkali-soluble resin (A), an amount of the polysiloxane polymer (B) is 5 to 150 parts by weight, the polysiloxane polymer (B) is synthesized by subjecting silane monomer, polysiloxane or a combination of the silane monomer and the polysiloxane into a hydrolysis and a partial condensation, and the silane monomer includes at least one silane monomer having a structure of formula (IV):

$$SiR^{27}{}_m(OR^{28})_{4-m} \qquad (VI)$$

wherein $R^{27}$ represents a hydrogen atom, an alkyl group with one to ten carbon atoms, an alkenyl group with two to ten carbon atoms or an aromatic group with six to fifteen carbon atoms, any one of the alkyl group, the alkenyl group and the aromatic group optionally has a substituted group, $R^{28}$ represents a hydrogen atom, an alkyl group with one to ten carbon atoms, an acyl croup with one to six carbon atoms or an aromatic group with six to fifteen carbon atoms, any one of the alkyl group, the acyl group and the aromatic group optionally has a substituted group, m is an integer of 1 to 3, all $R^{27}$ are the same or different from each other when m is 2 or 3, and all $R^{28}$ are the same or different from each other when (4-m) is 2 or 3, wherein at least one of $R^{27}$ is selected from 3-glycidoxy propyl, 2-(3,4-epoxy cyclohexyl) ethyl, 2-oxetanylbutoxypropyl, 3-propyl pentanedioic acid anhydride acid, 3-butanedioic acid anhydride and 2-butanedioic acid anhydride;
a compound containing vinyl unsaturated group(s) (C);
a photoinitiator (D);
a solvent (E);
a black pigment (F); and
a light stabilizer (G),
wherein the light stabilizer (G) includes a UV absorber (G-1) and/or a hindered amine (G-2).

2. The photosensitive resin composition of claim 1, wherein the epoxy compound having the at least two epoxy groups (a-1) comprises a structure of Formula (I):

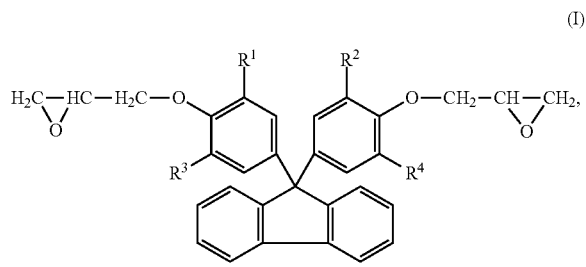

wherein $R^1$, $R^2$, $R^3$ and $R^4$ independently represent a hydrogen atom, a halogen atom, an alkyl group with one to five carbon atoms, an alkoxy group with one to five carbon atoms, or an aromatic hydrocarbon group with six to twelve carbon atoms.

3. The photosensitive resin composition of claim 1, wherein the epoxy compound having at least two epoxy groups (a-1) comprises a structure of Formula (II):

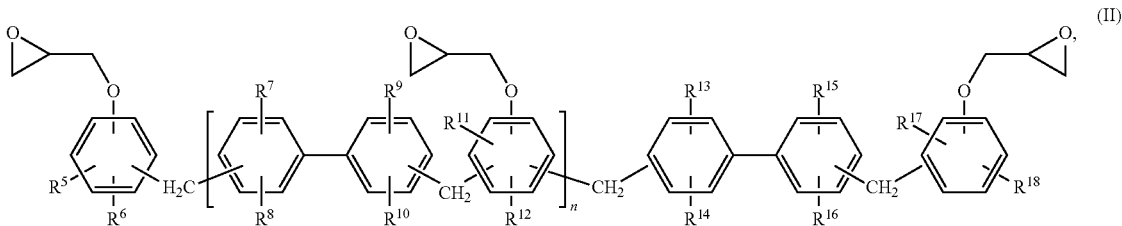

wherein $R^5$ to $R^{18}$ are the same or different from each other and each independently represents a hydrogen atom, a halogen atom, an alkyl group with one to eight carbon atoms or an aromatic hydrocarbon group with six to fifteen carbon atoms, and n represents an integer of zero to ten.

4. The photosensitive resin composition of claim 1, wherein the UV absorber (G-1) comprises a structure of Formula (III) or Formula (IV):

wherein $R^{19}$, $R^{20}$ and $R^{21}$ are the same or different from each other and each independently represents an organic group of with six to twenty-five carbon atoms;

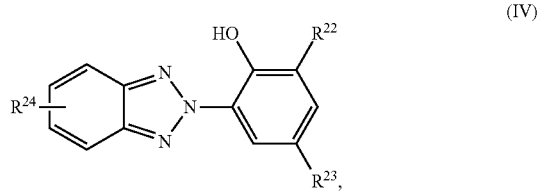

wherein $R^{22}$ and $R^{23}$ are the same or different from each other and each independently represents a hydrogen atom or an organic group of with one to thirty-five carbon atoms, and $R^{24}$ represents a hydrogen atom or a halogen atom.

5. The photosensitive resin composition of claim 1, wherein the hindered amine (G-2) comprises a structure of Formula (V):

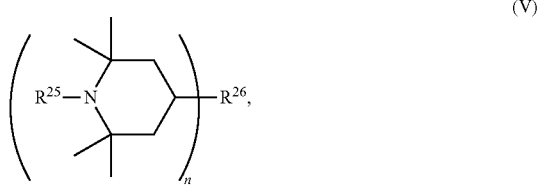

wherein $R^{25}$ and $R^{26}$ are the same or different from each other and each independently represents an organic group of with one to thirty carbon atoms, and n represents an integer of one to two.

6. The photosensitive resin composition of claim 1, wherein based on 100 parts by weight of the alkali-soluble resin (A), an amount of the resin having unsaturated group(s) (A-1) is 30 to 100 parts by weight, an amount of the compound containing vinyl unsaturated group(s) (C) is 5 to 220 parts by weight, an amount of the solvent (E) is 500 to 5000 parts by weight, an amount of the black pigment (F) is 50 to 800 parts by weight, and an amount of the light stabilizer (G) is 0.1 to 5 parts by weight.

7. The photosensitive resin composition of claim 1, wherein based on 100 parts by weight of the compound containing vinyl unsaturated group(s) (C), an amount of the photoinitiator (D) is 2 to 120 parts by weight.

8. A black matrix formed by the photosensitive resin of claim 1, wherein the photosensitive resin composition comprises:

an alkali-soluble resin (A), wherein the alkali-soluble resin (A) includes a resin having unsaturated group(s) (A-1), and the resin having unsaturated group(s) (A-1) is obtained by reacting a mixture that includes an epoxy compound having at least two epoxy groups (a-1) with a compound having at least one vinyl unsaturated group and carboxyl group (a-2);

a polysiloxane polymer (B), wherein a weight ratio [(A-1)/(B)] of the resin having unsaturated group(s) (A-1) and the polysiloxane polymer (B) is 0.8 to 10.0, based on 100 parts by weight of the alkali-soluble resin (A), an amount of the polysiloxane polymer (B) is 5 to 150 parts by weight, the polysiloxane polymer (B) is synthesized by subjecting silane monomer, polysiloxane or a combination of the silane monomer and the polysiloxane into a hydrolysis and a partial condensation, the silane monomer includes at least one silane monomer having a structure of formula (IV):

wherein $R^{27}$ represents a hydrogen atom, an alkyl group with one to ten carbon atoms, an alkenyl group with two to ten carbon atoms or an aromatic group with six to fifteen carbon atoms, any one of the alkyl group, the alkenyl group and the aromatic group optionally has a substituted group, $R^{28}$ represents a hydrogen atom, an alkyl group with one to ten carbon atoms, an acyl group with one to six carbon atoms or an aromatic group with six to fifteen carbon atoms, any one of the alkyl group, the acyl group and the aromatic group optionally has a substituted group, m is an integer of 1 to 3, all $R^{27}$ are the same or different from each other when m is 2 or 3, and all $R^{28}$ are the same or different from each other when (4-m) is 2 or 3, wherein at least one of $R^{27}$ is selected from 3-glycidoxy propyl, 2-(3,4-epoxy cyclohexyl) ethyl, 2-oxetanylbutoxypropyl, 3-propyl pentanedioic acid anhydride acid, 3-butanedioic acid anhydride and 2-butanedioic acid anhydride;

a compound containing vinyl unsaturated group(s) (C);
a photoinitiator (D);
a solvent (E);
a black pigment (F); and
a light stabilizer (G),
wherein the light stabilizer (G) includes a UV absorber (G-1) and/or a hindered amine (G-2).

9. A color filter characterized by including the black matrix of claim 8.

10. A liquid crystal display (LCD) device characterized by including the color filter of claim 9.

* * * * *